United States Patent
Wen et al.

(10) Patent No.: US 12,034,460 B2
(45) Date of Patent: Jul. 9, 2024

(54) APPARATUS AND METHOD FOR SIGMA-DELTA MODULATOR QUANTIZATION NOISE CANCELLATION

(71) Applicant: Ciena Corporation, Hanover, MD (US)

(72) Inventors: Tingjun Wen, Ottawa (CA); Sadok Aouini, Gatineau (CA); Naim Ben-Hamida, Nepean (CA); Matthew Mikkelsen, Nepean (CA); Soheyl Ziabakhsh Shalmani, Kanata (CA); Mohammad Honarparvar, Ottawa (CA)

(73) Assignee: Ciena Corporation, Hanover, MD (US)

(*) Notice: Subject to any disclaimer, the term of this patent is extended or adjusted under 35 U.S.C. 154(b) by 142 days.

(21) Appl. No.: 17/869,173

(22) Filed: Jul. 20, 2022

(65) Prior Publication Data
US 2024/0030932 A1    Jan. 25, 2024

(51) Int. Cl.
*H03M 3/00*    (2006.01)

(52) U.S. Cl.
CPC ............. *H03M 3/344* (2013.01); *H03M 3/50* (2013.01)

(58) Field of Classification Search
CPC ............... H03M 3/358; H03M 3/368; H03M 7/3004; H03M 1/066; H03M 1/125; H03M 1/34; H03M 1/466; H03M 1/50; H03M 1/002; H03M 1/0626; H03M 1/0687; H03M 1/0836; H03M 1/1014; H03M 1/12; H03M 1/182; H03M 1/201; H03M 1/48; H03M 3/322; H03M 3/328; H03M 3/344; H03M 3/378; H03M 3/414; H03M 3/436; H03L 7/1976; H03L 7/081; H03L 7/085; H03L 7/093; H03L 7/099; H03L 7/091; H03L 2207/50; H03L 7/0891; H03L 7/0991; H03L 2207/06; H03L 7/08; H03L 7/087; H03L 7/1974; H03L 7/0805; H03L 7/0814; H03L 7/0992; H03L 7/0998; H03L 7/183; H03L 7/0802; H03L 7/0995; H03L 7/18; H03L 7/197; H03L 7/04; H03L 7/0807;
(Continued)

(56) References Cited

U.S. PATENT DOCUMENTS

| 8,024,598 B2* | 9/2011 | Kim ....................... H03L 7/197 713/502 |
| 9,838,026 B2* | 12/2017 | Van Brunt ............ H03L 7/1976 |

(Continued)

*Primary Examiner* — Linh V Nguyen
(74) *Attorney, Agent, or Firm* — Young Basile Hanlon & MacFarlane, P.C.

(57) ABSTRACT

Described herein is a fractional phase locked loop with sigma-delta modulator (SDM) quantization noise cancellation. The fractional phase includes a digital filter configured to receive an error signal based on a comparison of a reference clock and a feedback clock, a controlled oscillator configured to generate an output clock by adjusting a frequency of the controlled oscillator based on a control signal output by the digital filter, the feedback clock being based on the output clock, a sigma-delta modulator configured to control division of the output clock to generate a divided output clock which includes a sigma-delta modulator quantization noise and a digital-to-time converter configured to receive a cancellation code from an integrator in the sigma-delta modulator and cancel the sigma-delta modulator quantization noise in the divided output clock with the cancellation code to generate the feedback clock.

16 Claims, 21 Drawing Sheets

(58) Field of Classification Search
CPC ..... H03L 7/0816; H03L 7/089; H03L 7/0893; H03L 7/0895; H03L 7/097; H03L 7/0996; H03L 7/1072; H03L 7/16; H03L 7/187; H03L 7/193
USPC .................................................. 341/143, 144
See application file for complete search history.

(56) References Cited

U.S. PATENT DOCUMENTS

| | | | | |
|---|---|---|---|---|
| 10,158,366 | B2* | 12/2018 | Galton | H03L 7/193 |
| 10,200,047 | B2* | 2/2019 | Markulic | H03L 7/081 |
| 10,511,315 | B1* | 12/2019 | Sarda | H03K 23/667 |
| 10,895,850 | B1* | 1/2021 | Elkholy | G04F 10/005 |
| 11,378,833 | B2* | 7/2022 | Ishizaki | G06F 3/044 |
| 11,569,831 | B1* | 1/2023 | Grimaldi | H03L 7/1976 |
| 2005/0285685 | A1* | 12/2005 | Frey | H03L 7/0891 |
| | | | | 331/16 |
| 2017/0366376 | A1* | 12/2017 | Wang | H04L 27/2017 |
| 2022/0014208 | A1* | 1/2022 | Choi | H03M 3/322 |
| 2022/0393565 | A1* | 12/2022 | Li | H03K 5/131 |

\* cited by examiner

APPARATUS AND METHOD FOR SIGMA-DELTA MODULATOR QUANTIZATION NOISE CANCELLATION

TECHNICAL FIELD

This disclosure relates to phase locked loops (PLLs). More specifically, this disclosure relates to a Sigma-Delta modulator (SDM) based fractional PLL with quantization noise cancellation circuitry.

BACKGROUND

Phase locked loops (PLLs) are widely used in a variety of electronic applications and circuits including, but not limited to, telecommunications, computers, clock and data recovery circuits, frequency synthesizers, and analog-to-digital convertors. PLLs can include integer-N PLLs and fractional-N PLLs (FPLLs). One implementation of a FPLL uses a sigma-delta modulator (SDM). The SDM is a digital circuit, which has a relatively small size in comparison to other FPLL implementations, and can run very fast even with a control bus width at or above 16-bits. The SDM-based FPLL can achieve a very fine fractional frequency resolution with a wide SDM bus. However, the SDM-based FPLL suffers from high quantization noise.

SUMMARY

Described herein are apparatus and methods for sigma-delta modulator (SDM) quantization noise cancellation.

In some implementations, a fractional phase includes a digital filter configured to receive an error signal based on a comparison of a reference clock and a feedback clock, a controlled oscillator configured to generate an output clock by adjusting a frequency of the controlled oscillator based on a control signal output by the digital filter, the feedback clock being based on the output clock, a sigma-delta modulator configured to control division of the output clock to generate a divided output clock which includes a sigma-delta modulator quantization noise and a digital-to-time converter configured to receive a cancellation code from an integrator in the sigma-delta modulator and cancel the sigma-delta modulator quantization noise in the divided output clock with the cancellation code to generate the feedback clock.

In some implementations, a digital-to-time converter includes a first circuit configured to receive a cancellation code and a second circuit configured to receive a clock embedded with a quantization noise due to a sigma-delta modulator. The first circuit and the second circuit are collectively configured to phase align and cancel the sigma-delta modulator quantization noise with the cancellation code to generate an output clock. The digital-to-time converter has a cancellation point based on setting a resistor-capacitor constant of the digital-to-time converter to a controlled oscillator target period and implementing to a defined voltage.

In some implementations, a method for improved quantization noise cancellation includes receiving, at a digital-to-time converter, a cancellation code from a sigma-delta modulator, receiving, at the digital-to-time converter, a clock embedded with a quantization noise due to the sigma-delta modulator, phase aligning, by the digital-to-time converter, the cancellation code with the quantization noise using a capacitor array controlled by the cancellation code and cancelling, by the digital-to-time converter, the quantization noise from the clock. The digital-to-time converter has a cancellation point based on setting a resistor-capacitor array constant of the digital-to-time converter to a controlled oscillator target period and implementing to a defined voltage.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
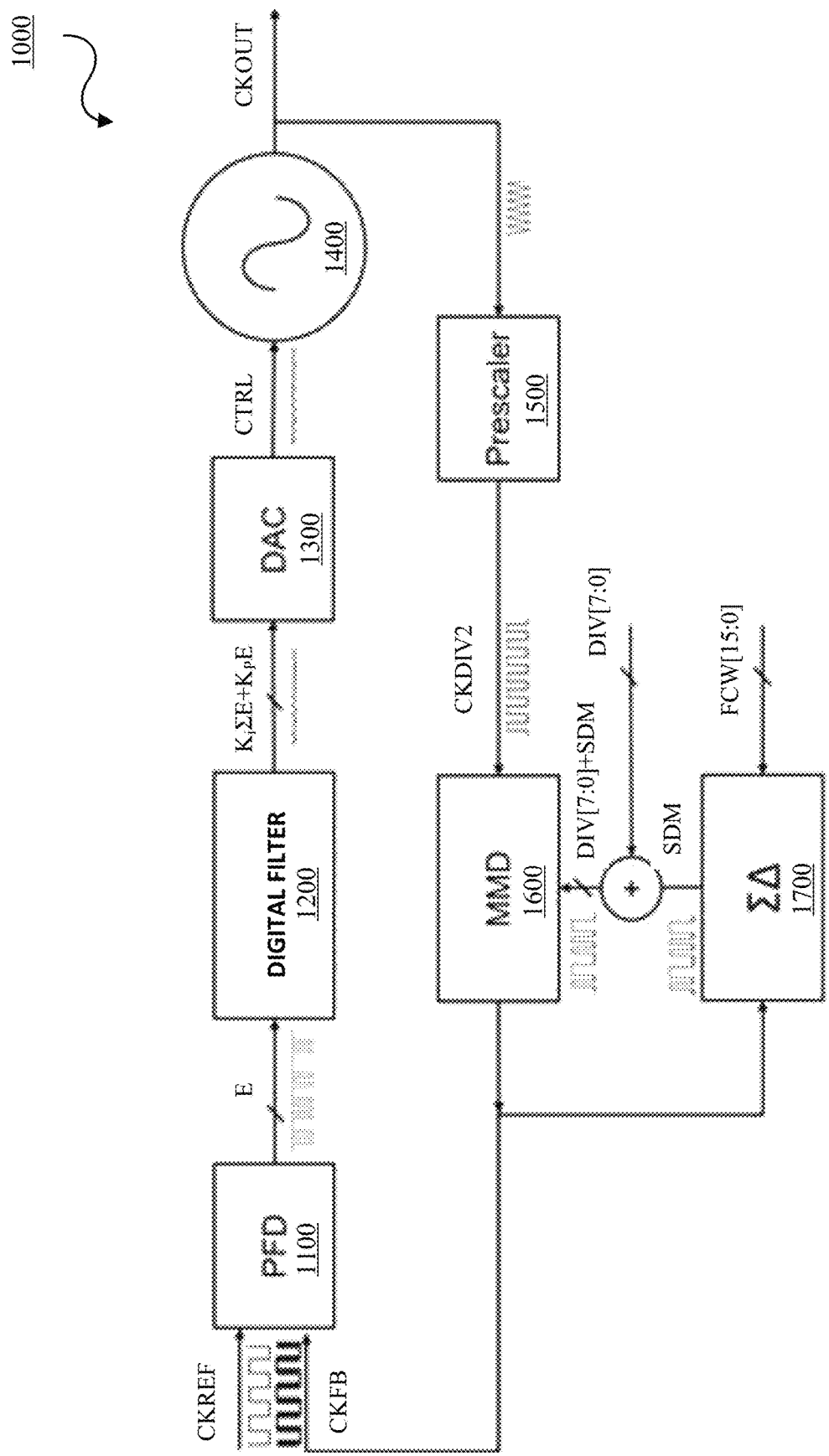
FIG. 1 is a block diagram of an example of a phase locked loop.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, and methods. Those of ordinary skill may thus recognize that other elements and/or steps may be desirable or necessary to implement the devices, systems, and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1 is a block diagram of an example sigma-delta modulator (SDM)-based fractional phase locked loop (FPLL) 1000. The FPLL 1000 includes a phase frequency detector (PFD) 1100, which has one input connected to a reference clock or signal (CKREF) and another input connected to a feedback clock or signal (CKFB). An output (error E) of the PFD 1100 is connected to a digital filter 1200, which has an output connected to an input of a digital-to-analog converter (DAC) 1300. The output of the digital filter 1200 includes an integral path and a proportional path ($K_I \Sigma E + K_P E$). An output (CTRL) of the DAC 1300 is connected to a controlled oscillator (CO) or voltage controlled oscillator (VCO) 1400. An output clock or signal (CKOUT) of the CO 1400 is the output of the PLL 1000, which is also connected to a prescaler 1500 to divide down the CKOUT and output a divided clock or signal (CKDIV2). The CKDIV2 is input to a multi-modulus divider (MMD) 1600, which in turn outputs the CKFB. The CKDIV2 input of the MMD 1600 is controlled or modulated by a sum of a divider control word (DIV[7:0]) and an output (SDM) of a SDM 1700. The SDM 1700 generates the SDM from controlling or modulating a CKFB input based on a frequency control word (FCW[15:0]). Those of ordinary skill may recognize that other elements may be desirable or necessary to implement the PLL 1100 described herein. However, because such elements are well known in the art, and because they do not facilitate a better understanding of the disclosed embodiments, a discussion of such elements may not be provided herein.

In this instance, the PLL 1000 is a digital PLL (DPLL) since the loop filter, the digital filter 1200, is a digital filter. The loop filter can be a low pass filter, an analog filter, a digital filter, and the like. The type of loop filter dictates, in part, whether a PLL is a digital PLL (DPLL), an analog PLL (APLL), a fractional DPLL (FDPLL), a fractional APLL (FAPLL), and the like. The use of the SDM 1700 in the PLL 1000 turns an integer mode PLL into a FPLL.

Although a conventional FDPLL, such as the PLL 1000 with the SDM 1700, can achieve very fine fractional frequency resolution with a wide SDM bus, high quantization noise is an issue. This is represented by the bold signal for CKFB at the input of the PFD 1100. A variety of techniques can be used to cancel quantization noise. These techniques include the use of a phase interpolator (PI), a phase rotator (PR), or a digital-to-time converter (DTC), where selection of a technique can depend, in part, on whether gain control is needed.

A common feature of SDM, PR, and DTC is their ability to delay or advance the phase of the CKFB with respect to the CKREF. Table 1 presents a comparison of characteristics of the SDM, PR, and DTC. In Table 1, M is the control bus width for the SDM, PR, and DTC, N is the feedback divider value, $F_{PR}$ is the PR rotation frequency, $P_{VCO}$ is the VCO period, and S is the PR step size.

TABLE 1

| Delay Type | Phase Range | Phase Resolution | Quantization Noise Peak-to-Peak | Frequency Resolution | Noise Shaping | Linearity Lookup Table | Physical Size |
|---|---|---|---|---|---|---|---|
| SDM | $P_{VCO}$ | $P_{VCO}/2^M$ | $P_{VCO}$ | $F_{VCO}/N/2^M$ | Yes | No | Small |
| PR | $P_{VCO}$ | $P_{VCO}/2^M$ | $S*P_{VCO}/2^M$ | $F_{PR}*S/2^M$ | No | Yes | Big |
| DTC | $N*P_{VCO}$ | $N*P_{VCO}/2^M$ | $N*P_{VCO}/2^M$ | $F_{VCO}/N/2^M$ | No | Yes | Big |

As shown in Table 1, both the PR and DTC have very low quantization noise bounded by a least signification bit (LSB) resolution, where the LSB is inversely proportional to $2^M$. The width of the control bus (M) for the PR and DTC is often limited to 8 to 10 bits due to its linearity. Control bus widths greater than 8 to 10 bits can result in differential nonlinearity (DNL) and integral nonlinearity (INL) becoming much bigger than 1 LSB. The control bus width is also limited by its quadratic size dependence on the bus width. A PR-based FPLL is suitable for applications in which the fractional division ratio is very close to an integer. In these conditions, the PR step size can be set very small so as not to glitch the high-speed divider (the MMO 1600) after the VCO (CO 1400). One such application in a coherent optical system is the line-side high-speed recovered clock. This high-speed recovered clock usually only requires an integer divider with a small 20 ppm frequency tracking range. The frequency resolution dependence on the rotator step size can be seen from the $F_{PR}*S/2^M$ equation. The frequency resolution of a DTC-based FPLL is constant with any fractional number. However, the DTC-based FPLL's requirement of a wide phase range coverage of $N*P_{VCO}$ makes it a real challenge to balance between frequency resolution, linearity, size, and power.

An advantage of the SDM is that it is a pure digital circuit. The SDM's size can comparatively be very small and run comparatively very fast even with a control bus width at or above 16 bits. For these reasons, the SDM is a nearly indispensable circuit in frequency synthesis applications in which the fractional value of the feedback divider value can be anywhere between 0.0 and 1.0 with a constant fine frequency resolution that is governed by $F_{VCO}/N/2^M$. On the downside, the SDM-based FPLL suffers from high quantization noise. A variety of techniques have been used, at the circuit level and at the architecture level, to address the SDM quantization noise There are two main categories of techniques that address the high quantization noise from the SDM. The first category employs a multi-bit time-to-digital converter (TDC) instead of a single bit phase detector (PD) to measure the overall quantization noise phase difference from the CKREF. The multi-bit TDC multi-bit output serves as the input to the digital filter. The multi-bit TDC cannot separate the VCO's random noise and the SDM's deterministic quantization noise. As a result, the VCO's random noise and the SDM's deterministic quantization noise are filtered by the same digital filter. The VCO's phase noise with an approximately negative 20 dB/dec to 30 dB/dec slope needs the FPLL loop bandwidth to be designed as wide as possible to filter out the high close-in VCO phase noise. The SDM shapes its quantization noise to high frequencies, which results in a phase noise plot with a positive 20 dB/dec or 40 dB/dec slope depending on the SDM order. This positive phase noise slope requires the FPLL loop bandwidth to be set as narrow as possible to filter out the higher quantization noise. These two conflicting requirements result in a compromised FPLL bandwidth to minimize overall output jitter. This compromised FPLL bandwidth might be acceptable for an inductance capacitance VCO (LC-VCO), which has the lowest phase noise among all VCOs. However, the compromised FPLL bandwidth is not optimal for Ring-based VCOs, where the main benefit is its small footprint but with a much higher phase noise.

The second category uses a DTC to generate a sequence of phases that can be used by the FPLL to cancel out the deterministic quantization noise. In implementations, the DTC generates a sequence of phase offsets from an integrator that is outside of the SDM. The integrator accumulates the SDM outputs to modulate the CKREF. When the modulated CKREF and the CKFB are compared by the PFD, the quantization noise is cancelled out. A benefit of the DTC solution is its ability of subtracting the quantization noise before the digital filter. This can be done because the SDM quantization noise is deterministic with a predicable sequence for any SDM FCW. After the quantization noise is cancelled out, the PFD only sees the VCO's random noise. As a result, the phase error skirt output of the PFD is greatly reduced. The digital filter only sees the random VCO noise so the FPLL's loop bandwidth can be set as wide as that of an integer mode PLL. A wider loop bandwidth is beneficial in that it can filter out as much as possible of the VCO random noise, which is the dominant noise source in the FPLL loop. A major issue with a DTC based SDM quantization cancellation scheme is that it requires a delay element that covers more than one period of the CKREF. It is prohibitive to design a delay element with a wide control bus to cover such a large phase range with fine resolution and decent linearity. The power consumption and area required for such a wide range DTC is also an issue. Moreover, the gain of a DTC is sensitive to process, voltage, and temperature (PVT) and a gain control loop is needed to make the gain constant to minimize the FPLL output jitter over PVT sensitivities.

Each of the previously known techniques have a number of issues. Some techniques do not separate the deterministic quantization noise and the random VCO noise before the phase detector. Some techniques require an extra external integrator circuit. Some techniques suffer from non-linearity issues, which in turn result in non-linear induced noise. Some techniques do not address memory effects, which leads to imprecise quantization noise cancellation. That is, these techniques lack a way to reset or clear out a capacitance effect.

Described herein are devices, circuits, and methods for SDM quantization noise cancellation in PLLs, FPLLs, DFPLLs, and the like. In these implementations, the deterministic SDM quantization noise is cancelled prior to arrival at a phase detector. Consequently, the PLL loop can operate with a wider bandwidth to suppress more VCO random noise. As discussed above, the PLL bandwidth would have to be narrowed to suppress both the quantization noise from the SDM and the random noise from the VCO, which in turn leads to higher and bigger jitter in the PLL. An internal signal inside the SDM is used to cancel out the quantization noise precisely. This signal is used by the SDM to generate the fine fractional frequency but also generates the quantization noise as a side effect. The implementations take advantage of the linear relationship between t and C in a resistor-capacitor (RC) delay circuit. The implementations avoid the t and $V_{REF}$ non-linear relationship. The t and $V_{REF}$ relation is only used for near static calibration in a least means square (LMS) algorithm as described herein. The implementations include a reset circuit to clear previous memory effects. Collectively, precise cancellation of the quantization noise is provided. The ability to provide low jitter, high and low speed wide tuning ranges, small size, and low power fractional frequency synthesis is increasingly important as form factor shrinks significantly.

Figure 2:
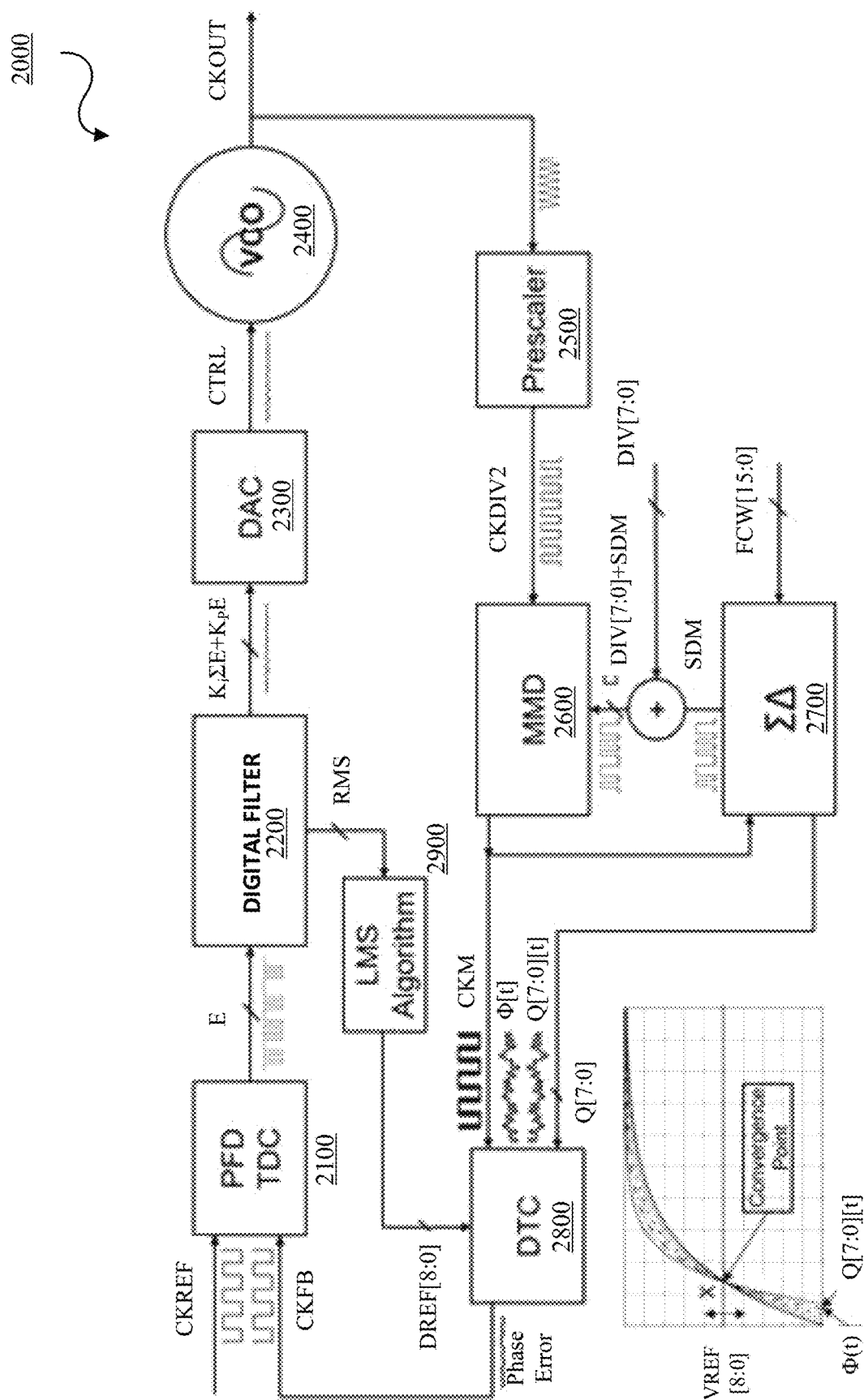
FIG. 2 is a block diagram of an example of a sigma-delta modulator (SDM)-based fractional phase locked loop (FPLL) in accordance with embodiments of this disclosure.

FIG. 2 is a block diagram of an example of a sigma-delta modulator (SDM)-based fractional phase locked loop (FPLL) 2000 in accordance with embodiments of this disclosure.

The FPLL 1000 includes a PFD 2100 with a TDC 2110, the PFD 2100 having one input connected to a CKREF and another input connected to a CKFB. An output (digitized error E) of the TDC 2110 is connected to a digital filter 2200, which has an output connected to an input of a DAC 2300. The output of the digital filter 2200 includes an integral path and a proportional path ($K_I\Sigma E+K_P E$). An output (CTRL) of the DAC 2300 is connected to a CO or VCO 2400. An output CKOUT of the CO 2400 is the output of the PLL 2000, which is also connected to a prescaler 2500 to divide down the CKOUT and output a CKDIV2. The CKDIV2 is input to a MMD 2600. The CKDIV2 input of the MMD 2600 is controlled or modulated by a sum of a divider control word (DIV[7:0]) and an output (SDM) of a SDM 2700. The SDM 2700 generates the SDM from controlling or modulating an output clock or signal (CKM) of the MMD 2600 based on FCW[15:0]. Consequently, the CKM includes a SDM quantization noise $\Phi[t]$. A DTC 2800 has one input connected to the CKM with the $\Phi[t]$ and has another input connected to a cancellation code (Q[7:0][t]), which is tapped from an internal integrator in the SDM 2700 as described herein. The DTC 2800 can substantially cancel out the SDM quantization noise using the cancellation code. The DTC 2800 is in effect or performs as a quantization noise cancellation circuit. As described herein, timing alignment between the MMD 2600, the SDM 2700, and the DTC 2800 is substantially maintained if a convergence point or optimal cancellation point of the DTC 2800 remains within a defined range if a target frequency (e.g., CKOUT) of the CO or VCO 2400 is changed because of a change in the programmable feedback divider value (e.g., a change in the value for the MMD 2600 and/or the SMD 2700), a change due to PVT considerations, and/or combinations thereof. In some implementations, the defined range is +/−15%. The defined range can vary on VCO and/or application requirements. In some implementations, the DTC 2800 can include a comparator with a programmable reference voltage ($V_{REF}$) to match a new or changed convergence point or optimal cancellation point. In these implementations, the reference voltage can be set based on a DTC reference code (DREF) generated by a least mean square root (LMS) algorithm using root mean square (RMS) and peak-to-peak statistical outputs of the digital filter 2200 to optimize an overall jitter of the PLL 2000.

The DTC 2800 is a resistor-capacitor (RC) delay type DTC. As described herein below, the DTC 2800 includes a capacitor array, which is digitally controlled to achieve the desired phase delay. Operation of the DTC 2800 can be understood by first starting with the RC delay equation with a step stimulus:

$$V_{out} = V_{dd} \cdot \left(1 - e^{\frac{-t}{R(Q \cdot C_u + C_p)}}\right) \quad \text{Equation (1)}$$

where $V_{out}$ is the RC output, $V_{dd}$ is the power supply, t is the time, R is the resistance, Q is the digital control code, $C_u$ is the digital controlled unit capacitance, and $C_p$ is the lump-sum parasitic capacitance. Re-writing t as the function range and Q as the domain, Equation (1) becomes:

$$t = \ln\left(1 - \frac{V_{out}}{V_{dd}}\right) \cdot R \cdot (Q \cdot C_u + C_p) \quad \text{Equation (2)}$$

Applying differentiation to both side with respect to the digital control word Q, Equation (2) becomes:

$$\Delta t = -\ln\left(1 - \frac{V_{out}}{V_{dd}}\right) \cdot R \cdot C_u \cdot \Delta Q \quad \text{Equation (3)}$$

As shown, the $\Delta t$ or delay is inherently linearly related to the digitally controlled unit capacitance $C_u$ and/or $\Delta Q$ whereas the $\Delta t$ or delay is exponentially related to $V_{out}$. This provides dynamic straightforward control of the phase delay and alignment of the cancellation code with the quantization noise in the CKM. This linear relationship between $\Delta t$ and $\Delta Q$ is a reason that a look up table (LUT) is not needed for this RC based DTC since the differential nonlinearity (DNL) and the integral nonlinearity (INL) of this RC based DTC is not caused by the non-linear relationship but rather by a layout dependent mismatch effect. If $\Delta t$ is nonlinear to $\Delta Q$ by design, then a fine DNL and INL cannot be easily achieved without a LUT. This is the case for phase rotator based or phase interpolator-based designs, where the $\Delta t$ vs $\Delta Q$ relationship is dominated by the inherently nonlinear transistor $I_{ds}$ equations.

It is assumed that at time 0, the initial value of V is at a constant voltage of 0. This is operationally implemented by using a reset signal such that every new delay t(n+1) by a new digital control code Q(n+1) starts from zero voltage, i.e., without having any memory from previous delays. This is further discussed with respect to FIG. 10 and FIG. 14 below.

For the DTC 2800, a convergence point or optimal cancellation point (herein convergence point) X is at (0.69RC$_{fs}$, 0.5) if R and $C_u$ are set such that RC$_{fs}$=T$_{vco}$, where C$_{fs}$ is the full scale of the digitally controlled capacitor array and T$_{vco}$ is the target VCO period. That is, the convergence point is defined or initially set for a PLL or the DTC component in the PLL by matching the RC to the reciprocal of the center frequency of the VCO tuning range. The DTC 2800 does not need to cover the whole period of the reference clock. The DTC 2800 covers a period of the VCO.

As described herein, the convergence point X can be adjusted, if necessary, even if the VCO running frequency shifts from the center frequency or the unit delay capacitor in the DTC 2800 changes due to PVT variation. A comparator with a programmable $V_{REF}$ can be used in the DTC 2800 to track the vertical moment of the convergence point X. Fine tuning the changing R or C or the charging current to match the changing VCO period with the needed precision is much more complex and challenging than moving only the $V_{REF}$ level vertically to match the new convergence point X. As described herein, the DTC 2800 does not need to adjust the gain of the delay gain to match the changing VCO period and the changing unit delay value due to PVT variation.

Figure 3:
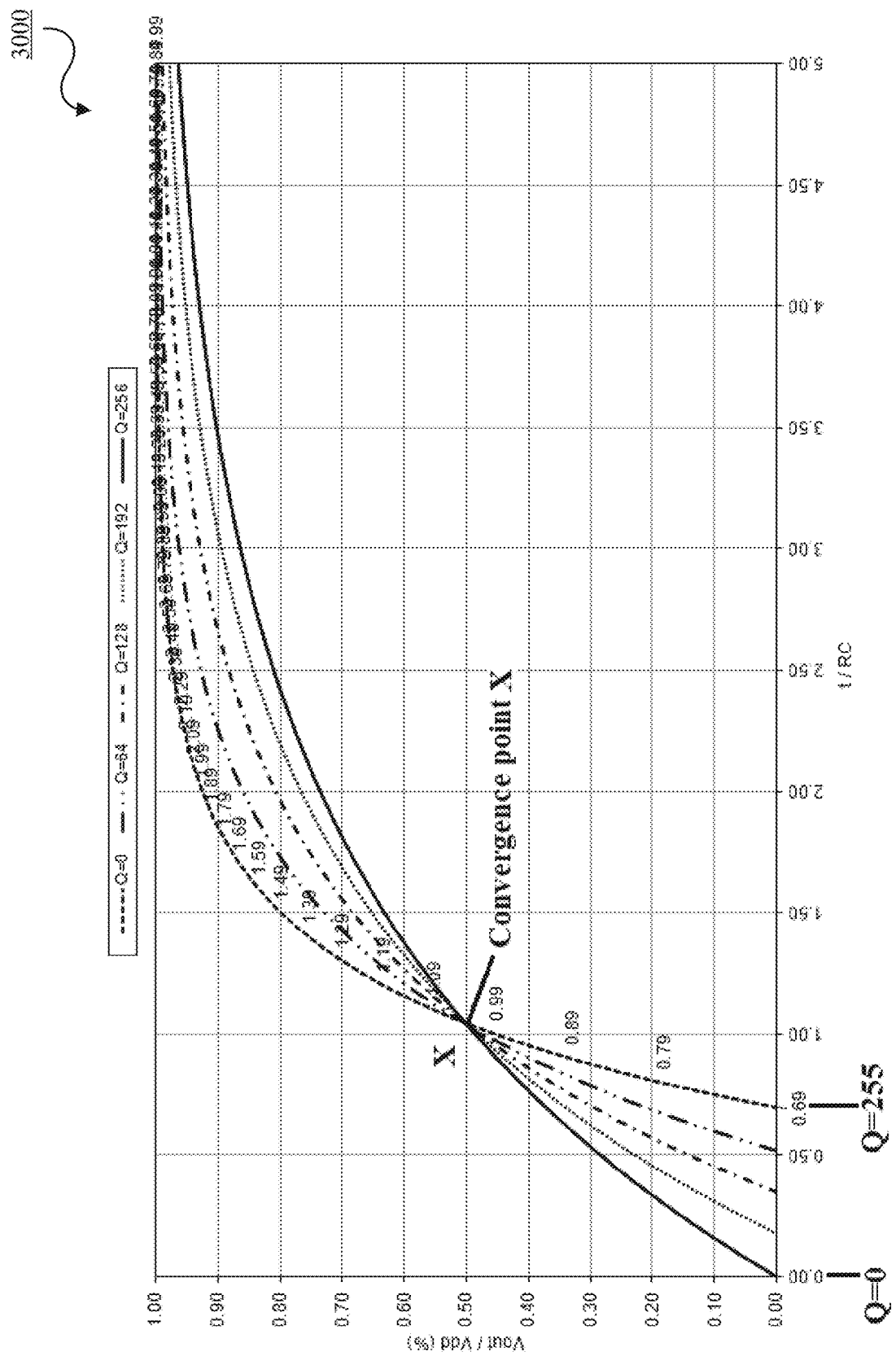
FIG. 3 is a diagram illustrating a convergence point or an optimal cancellation point in accordance with embodiments of this disclosure.

The horizontal movement of the convergence point X does not need to be tracked. This means that the DTC is insensitive to parasitic capacitance. It results in robust circuit and requires much relaxed layout effort. FIG. 3 shows a normalized $V_{out}$ vs t plot showing the convergence point X. In implementations, the convergence point X can be set a middle rail during the initial design stage.

Figure 4:
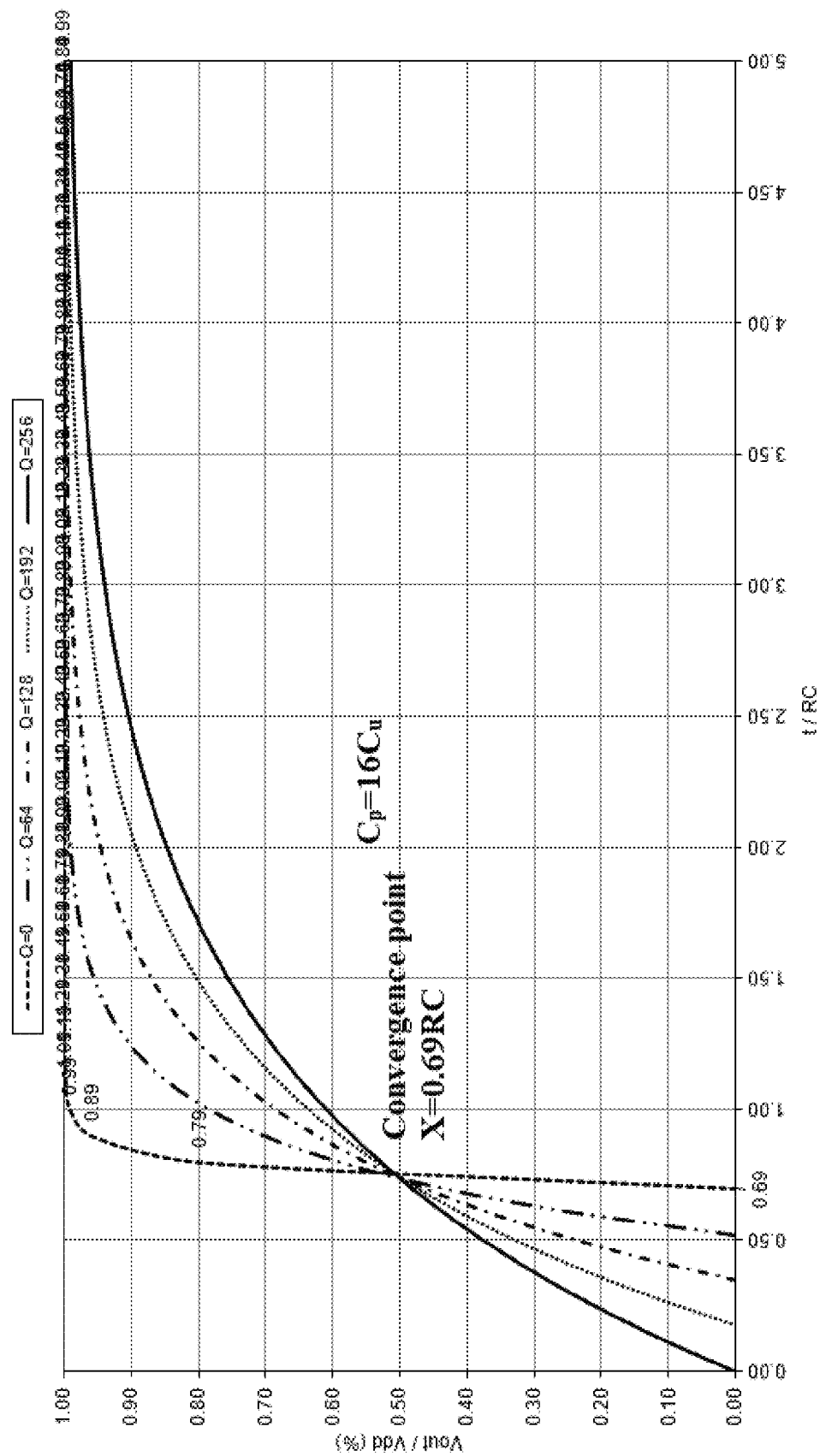
FIG. 4 is a diagram illustrating movement of the convergence point or the optimal cancellation point of FIG. 3 due to parasitic capacitance in accordance with embodiments of this disclosure.
Figure 5:
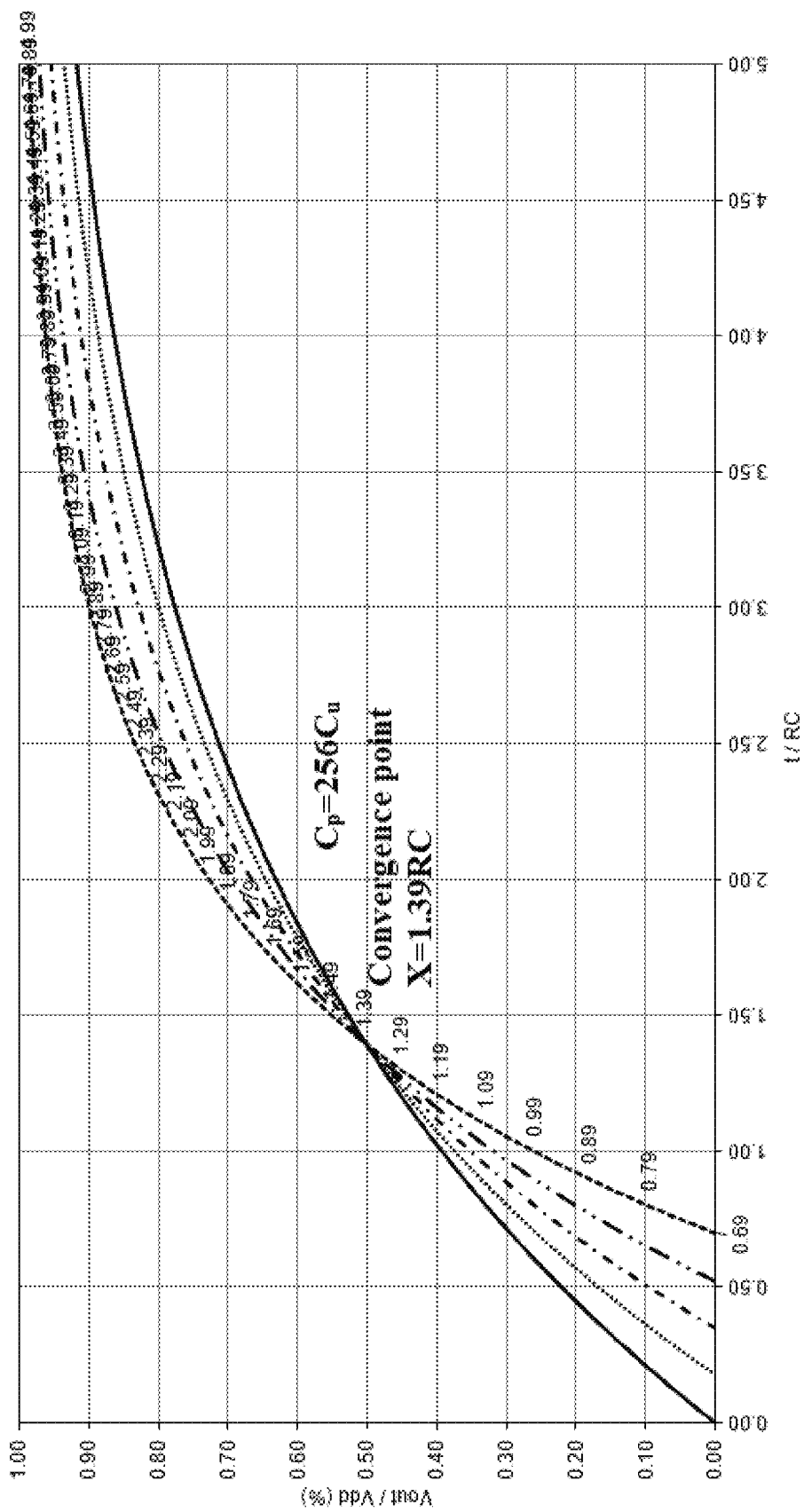
FIG. 5 is another diagram illustrating movement of the convergence point or the optimal cancellation point of FIG. 3 due to parasitic capacitance in accordance with embodiments of this disclosure.

In the DTC quantization noise cancellation application, $\Delta t$ is the parameter of interest in achieving optimum cancellation. As shown in Equation (3), $\Delta t$ is insensitive to the parasitic capacitance $C_p$ as the horizontal shift due to the constant parasitic capacitance in Equation (2) disappears in Equation (3) after derivation. The parasitic capacitance $C_p$ only shifts the convergence point X horizontally as shown in FIGS. 4 and 5. Minimizing the parasitic capacitance $C_p$ is critical in various circuits with stringent precision requirements. The horizontal delay shift can be easily corrected by the FPLL 2000 integral path (i.e., $K_I \ominus E$). This greatly simplifies the layout. The disclosed DTC has a much more relaxed capacitor array layout wiring constraint due to the insensitivity to the parasitic capacitance $C_p$.

Figure 6:
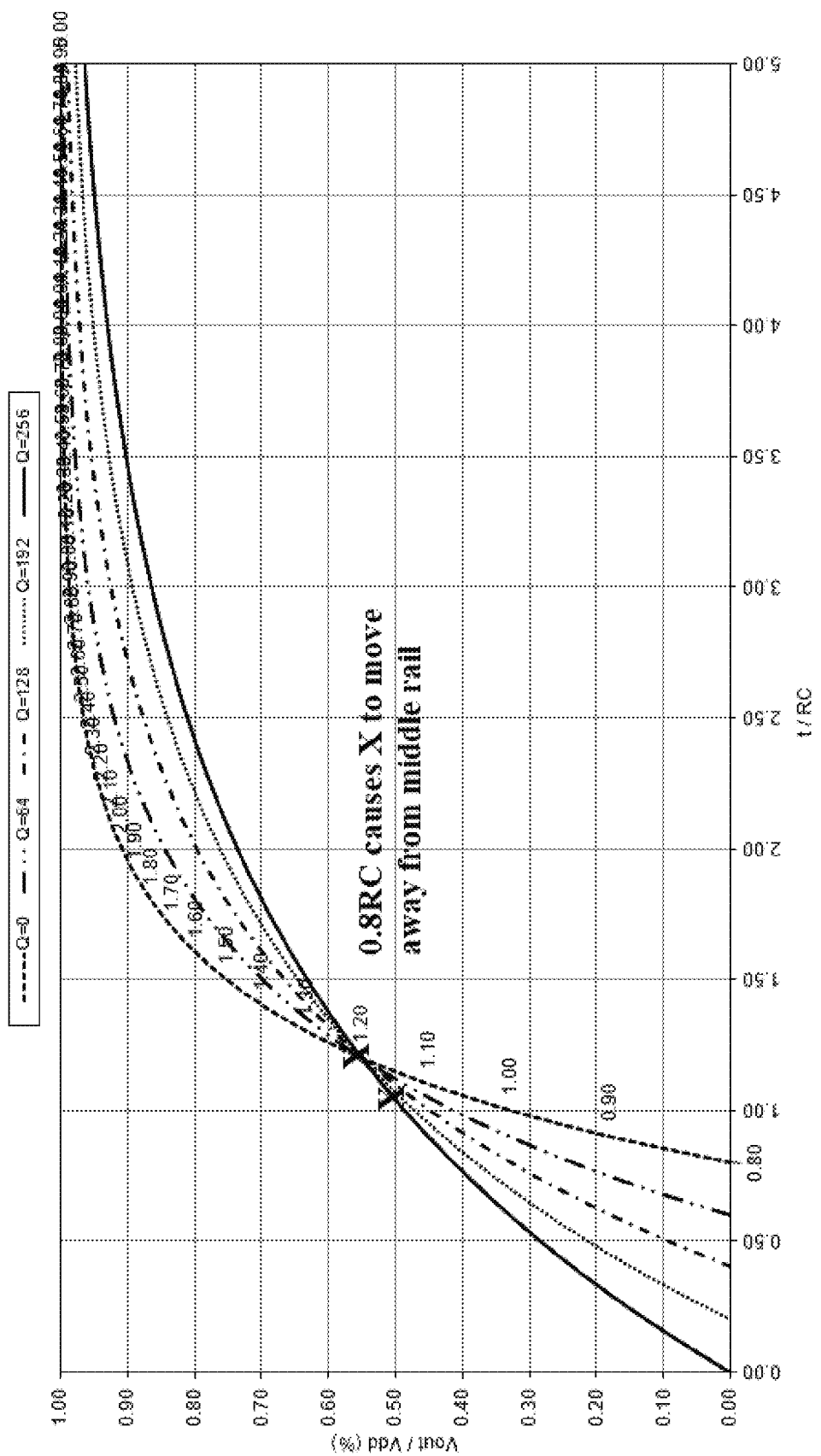
FIG. 6 is a diagram illustrating movement of the convergence point or the optimal cancellation point of FIG. 3 due to process-voltage-temperature (PVT) and feedback divider variation in accordance with embodiments of this disclosure.
Figure 7:
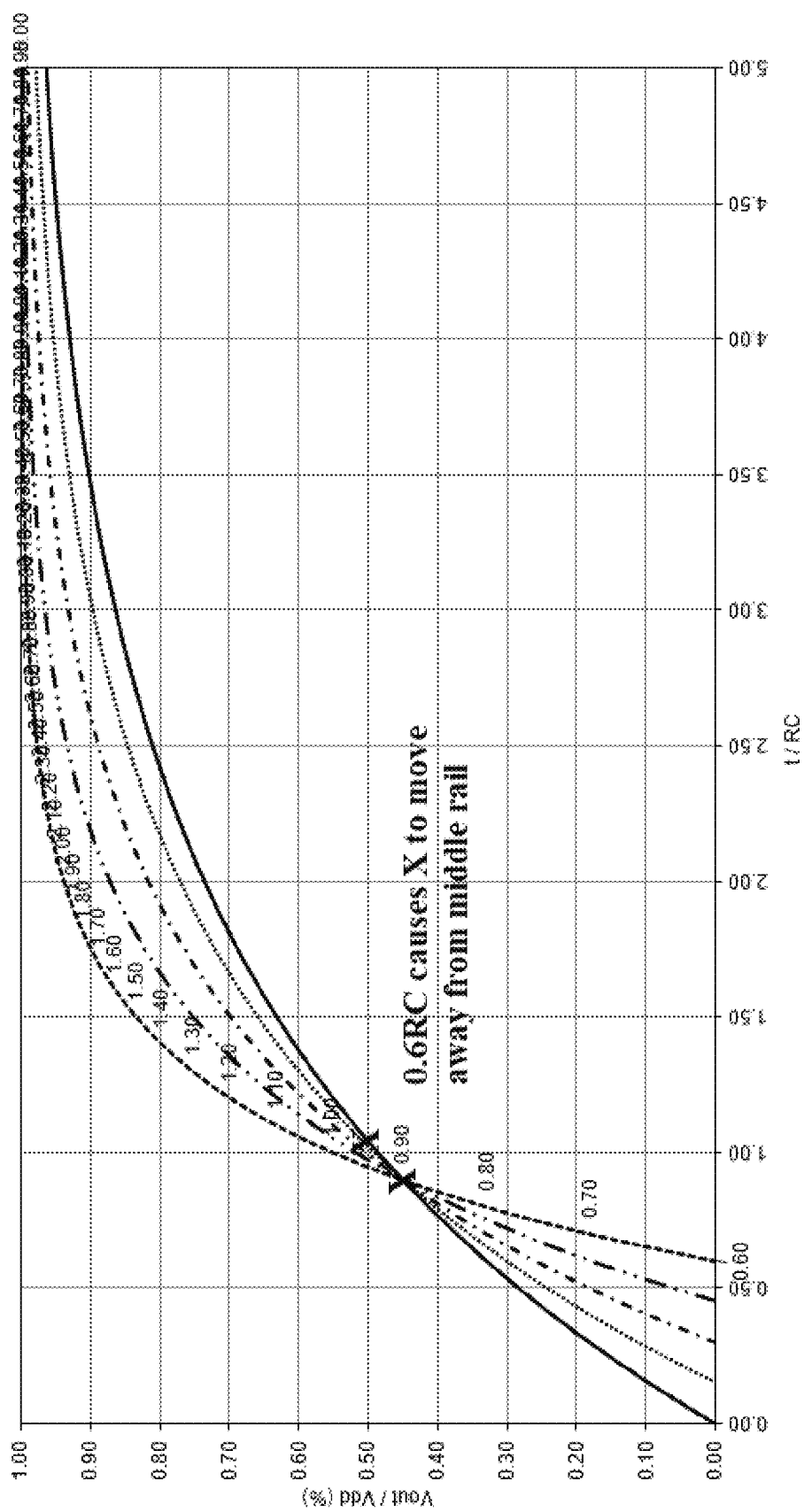
FIG. 7 is another diagram illustrating movement of the convergence point or the optimal cancellation point of FIG. 3 due to process-voltage-temperature (PVT) and feedback divider variation in accordance with embodiments of this disclosure.

As noted, when the target VCO frequency is changed because of the programmable feedback divider value change or the PVT change, the convergence point X will move around the initial designed middle rail point horizontally and vertically as shown in FIGS. 6 and 7. The convergence point X moving horizontally poses no risk to the correct operation of the PLL 2000 as it is equivalent to the effect of extra parasitic capacitance. Convergence point X moving vertically (i.e., quantization jitter) can be compensated by adding a comparator after the RC delay circuit with a programmable reference voltage $V_{REF}$. The quantization jitter is minimized by programming the comparator's $V_{REF}$ to match the new convergence point. This means a complex circuitry to dynamically adjust the gain of the DTC is not needed to precisely match the full-scale delay to the targeted CKDIV2 period. To adjust the gain of a DTC, the R or unit capacitance $C_u$ has to be trimmed with precision. As shown previously, adding extra parallel capacitors do not change the gain in the DTC 2800. The extra parallel capacitors shift the convergence point X horizontally. Adjusting the RC gain is much more difficult and less practical than programming the $V_{REF}$ of a comparator.

Figure 8:
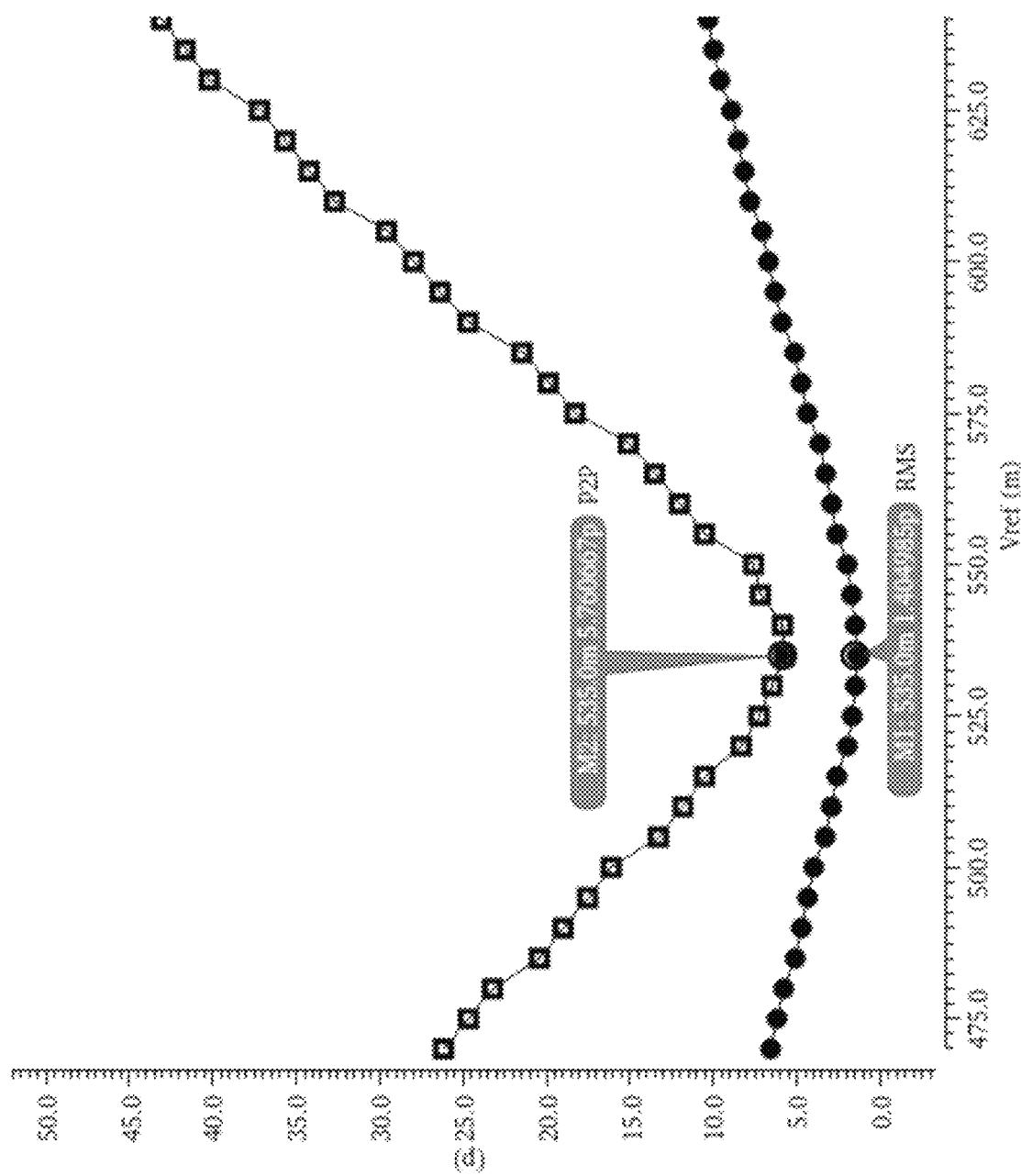
FIG. 8 is a diagram illustrating determination of an optimal $V_{ref}$ in accordance with embodiments of this disclosure.

Simulations using real circuits and CMOS process technologies show that the vertical movement of the convergence point X is sensitive to different corners but is within the comparator's working range. The vertical movement of the convergence point X is very insensitive to power supply change as $V_{REF}$ can be designed to accurately track the power change. The vertical movement of the convergence point X is nearly insensitive to temperature change. Because the corner variation and the power supply change are static, $V_{REF}$ scarcely needs any dynamic adjustment once $V_{REF}$ is fixed at startup. Since the temperature slew rate is in the order of a few degrees per second and it only moves the convergence point by a very small percentage, a somewhat slow firmware least mean square root (LMS) algorithm can be used to track this change. FIG. 8 is a plot illustrating determination of an optimal $V_{REF}$ in accordance with embodiments of this disclosure. In this plot, the LMS algorithm can use either a RMS statistical output from the digital filter 2200, a peak-to-peak statistical output from the digital filter 2200, or both to determine the optimal VREF The values and curves shown are illustrative.

If the initial design of the feedback divider value N is greater than 10 when the VCO frequency is centered, N−1 or N+1 will not shift the convergence point X significantly. That is, the change is within a defined range. The bigger the N, the less effect it has on the convergence point X. Therefore, changes in the feedback divider value change pose no practical problem in implementations. It is within the comparator's capability to track changes by a fixed new $V_{REF}$ value that can be calculated from the new N and fractional control word (FCW).

Referring back to FIG. 2 and as noted herein, the CKM contains the quantization phase noise sequence ϕ[t] that can be as high as one period of the MMD input clock CKDIV2. The quantization phase noise sequence ϕ[t] is long and resembles a random pattern but it is completely predictable given any DIV and FCW values. A discovery has been made that the output digital bus value of a first integrator output of a SDM has a proportional pattern of the quantization noise profile. Upon investigation, this is because the structure of an SDM includes operations required to express the quantization phase noise contribution of the SDM on the PLL within which the SDM is operating in. Knowing that a FDPLL will lock the time-averaged frequency of the sigma-delta modulated divider output to the reference clock, the difference between the SDM output and the FCW divided by the full-scale range (FSR) of the SDM quantizer represents the frequency quantization noise. The subtraction operation between the SDM output scaled up by the FSR fed back towards the input and the FCW is a proportional operation. Since the derivative of phase is $2\pi$ times frequency, it is known that a digital accumulator can be used as an integrator to convert frequency quantization noise to phase quantization noise.

Figure 9:
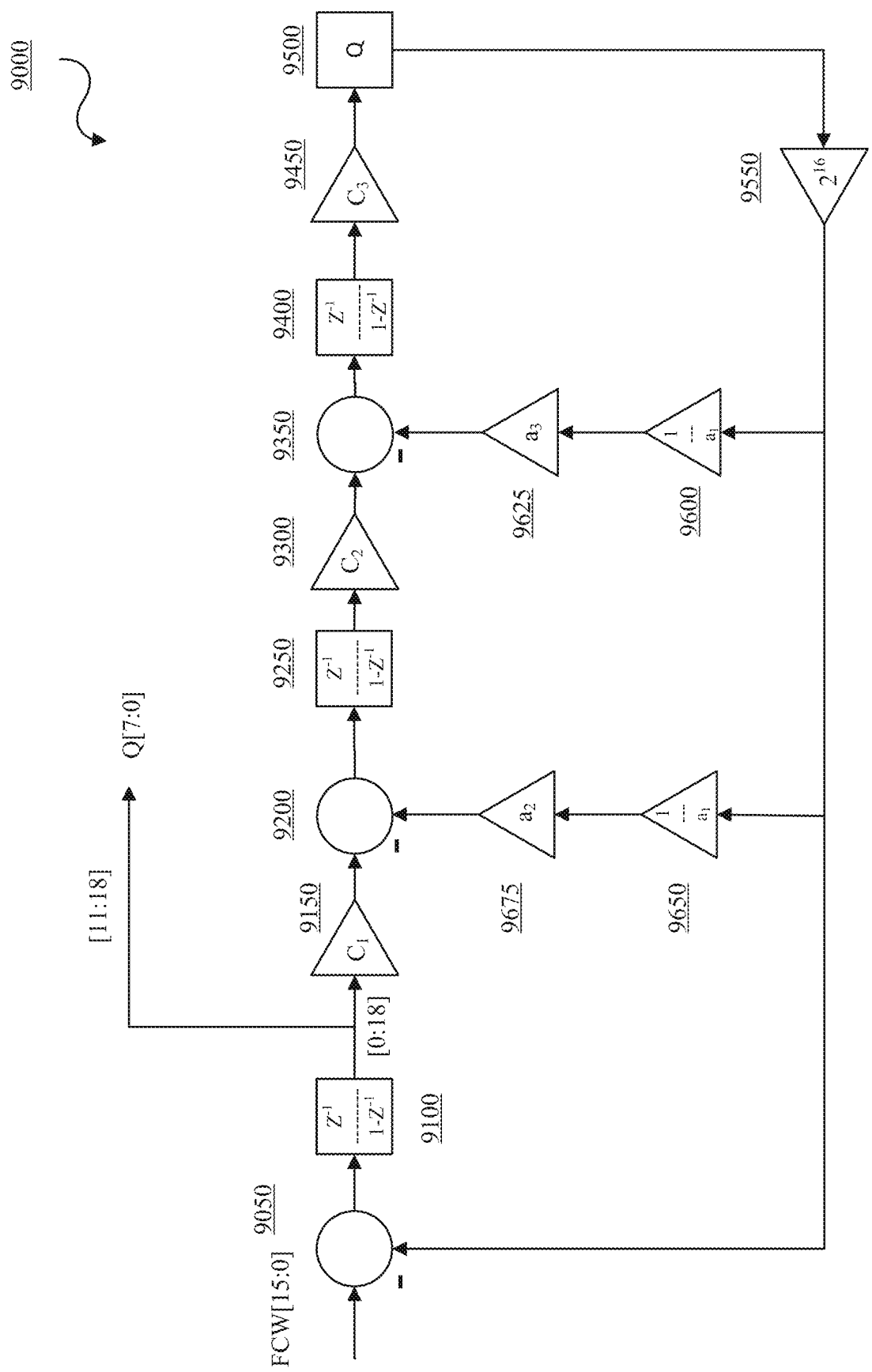
FIG. 9 is a block diagram of an example of a SDM for the SDM-based FPLL of FIG. 2 in accordance with embodiments of this disclosure.

FIG. 9 is a block diagram of an example of a SDM 9000 for the SDM-based FPLL 2000 of FIG. 2 in accordance with embodiments of this disclosure. The SDM 9000 includes a summer 9050 which has a FCW as an input. An output of the summer 9050 is connected to an input of a first integrator 9100, which in turn has an output connected to a gain element 9150 with a gain coefficient $C_1$. An output of the gain element 9150 is input to a summer 9200, which in turn has an output connected to an input of a second integrator 9250. An output of the second integrator 9250 is input to a gain element 9300 with a gain coefficient $C_2$, which in turn has an output connected to an input of a summer 9350. An output of the summer 9350 is connected to an input of a third integrator 9400, which in turn has an output connected to a gain element 9450 with a gain coefficient $C_3$. An output of the gain element 9450 is connected to an input of a quantizer 9500. An output of the quantizer 9500 is an output of the SDM 9000, i.e., SDM in FIG. 2. The SDM is also an input to a $2^{16}$ DAC 9550. An output of the $2^{16}$ DAC 9550 is connected to an input of a gain element 9600 with a gain coefficient $1/a_1$, an input of a gain element 9650 with a gain coefficient $1/a_1$, and a subtraction input of the summer 9050. An output of the gain element 9600 is connected to an input of a gain element 9625 with a gain coefficient $a_3$, which in turn is connected to a subtraction input of the summer 9350. An output of the gain element 9650 is connected to an input of a gain element 9675 with a gain coefficient $a_2$, which in turn is connected to a subtraction input of the summer 9200.

Referring also to FIG. 2, and as noted herein, the CKM contains the quantization phase noise sequence ϕ[t] that can be as high as one period of the MMD input clock CKDIV2. The quantization phase noise sequence ϕ[t] is long and resembles a random pattern but it is completely predictable given any DIV and FCW values. A discovery has been made that the output digital bus value of the first integrator 9100 of a SDM has a proportional pattern of the quantization noise profile. Upon investigation, this is because the structure of an SDM includes operations required to express the quantization phase noise contribution of the SDM on the PLL within which the SDM is operating in. Knowing that a PLL will lock the time-averaged frequency of the sigma-delta modulated divider output (CKFB) to the reference clock (CKREF), the difference between the SDM output and the FCW divided by the full-scale range (FSR) of the SDM quantizer represents the frequency quantization noise. The subtraction operation between the SDM output scaled up by the FSR fed back towards the input and the FCW is a proportional operation. Since the derivative of phase is $2\pi$ times frequency, it is known that a digital accumulator, i.e., the first integrator 9100, can be used as an integrator to convert frequency quantization noise to phase quantization noise.

As shown in FIG. 9, the summer 9050 performing as a subtractor and the first integrator 9150 generates a signal proportional but opposite in sign to the phase quantization noise contribution of the SDM normalized to one input divider period (CKDIV2 in the example shown in FIG. 2). Instead of adding another standalone integrator to integrate the product of SDM and FCW outside of the existing SDM, the output of the first integrator 9100 can be tapped to obtain the quantization cancellation code to completely cancel out the quantization noise. This saves an extra integrator and simplifies the timing alignment analysis and verification between various blocks. The output bus width of the first integrator 9100 is 19 bits wide for the 16-bit SDM 9000 shown in FIG. 9. To interface with the DTC control bus Q[7:0], not all 19 bits are needed. Since the accumulator, i.e., the first integrator 9150, the second integrator 9250, and the third integrator 9400, are minimally sized in this structure, the upper 8-bit MSBs are used in this example. Minimally sized refers to each digital accumulator using the minimum number of bits, such that the most significant bit MSB is representative of the sign of the error. The structure that generates the signal proportional to the phase quantization noise is not unique to the SDM architecture shown and are present in all SDMs. Therefore, this discovery can be applied to various implementations. The gain coefficients within the SDM 9000 are not relevant here. In implementations where the gain coefficients are in the path between the output of the quantizer 9500 or FCW input and the output of the first integrator 9100, the gain coefficients can be accounted for either in the DTC range and/or the range of bits selected for the quantization cancellation code. In some implementations, a multi-bit quantizer SDM would also work with this cancellation scheme. This would require the DTC 2800 to cover multiple input divider periods.

As noted, correct timing alignment is needed between the MMD 2600, the SDM 2700, and the DTC 2800. However, once the timing alignment is designed correctly, the convergence point X of the DTC 2800 can be maintained or guaranteed as described herein. Since no complex automatic gain control circuitry is needed, a relatively simple LMS algorithm in either register transfer language (RTL) or firmware (FW) can use the RMS and/or peak-to-peak statistical outputs from the digital filter 2200 to optimize the overall jitter of the PLL 2000. The LMS algorithm controls a comparator's $V_{ref}$ inside the DTC 2800.

Figure 10:
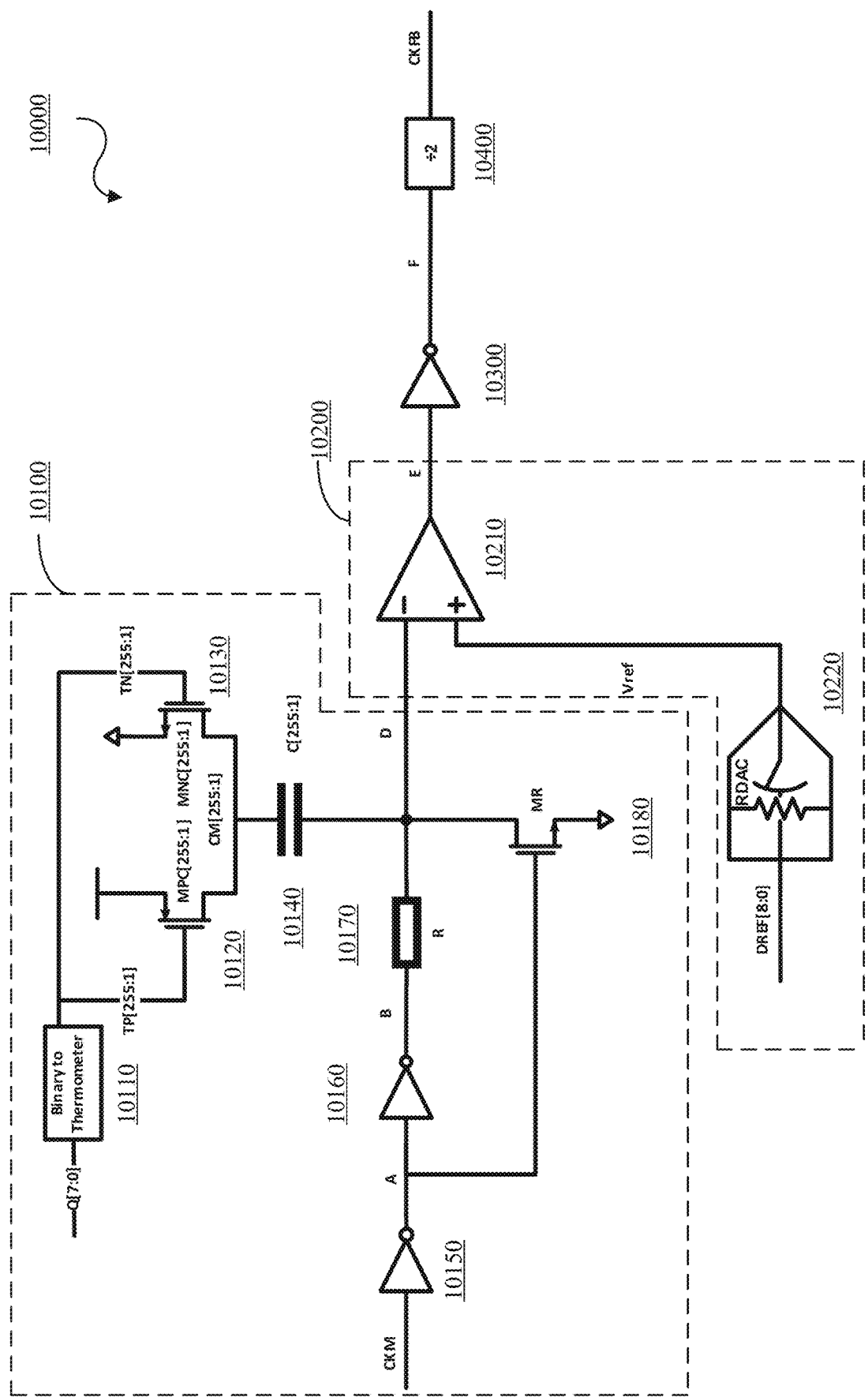
FIG. 10 is a block diagram of an example of a digital-to-time converter (DTC) for the SDM-based FPLL of FIG. 2 in accordance with embodiments of this disclosure.

FIG. 10 is a block diagram of an example of a DTC 10000 for the SDM-based PLL 2000 of FIG. 2 in accordance with embodiments of this disclosure. The DTC 10000 includes a cancellation circuit 10100, an optimal cancellation point adjustment circuit 10200, an inverter 10300, and a divider 10400. For example, the divider 10400 can be a divide by 2 divider. A cancellation code (Q[7:0]) and a CKM are inputs to the cancellation circuit 10100.

The cancellation circuit 10100 includes a binary-to-thermometer converter 10110, which has an input connected to the cancellation code. An output of the binary-to-thermometer converter 10110 is connected to an array of p-channel transistors (MPC [255:1]) or switches 10120 and an array of n-channel transistors (MNC [255:1]) or switches 10130. Specifically, the output of the binary-to-thermometer converter 10110 is connected to a respective gate of a p-channel transistor (MPC) 10120 and a respective gate of a n-channel transistor (MNC) 10130. Each source of the MPC array 10120 is tied to $V_{DD}$ and each source of the MNC array 10130 is tied to ground. Each drain of the MPC array 10120 and the drain of the MNC array 10130 is connected to one end of a respective capacitor in a capacitor array C[255:1] 10140. The binary-to-thermometer converter 10110, the transistors 10120 and 10130, and the capacitor array 10140 can be referred to as a first circuit.

The cancellation circuit 10100 includes an inverter 10150, which has an input connected to the CKM. An output of the inverter 10150 is connected to an input of an inverter 10160, which in turn has an output connected to one end of a resistor 10170. Each remaining end of the capacitor array 10140, the remaining end of resistor 10170, and a drain of a reset transistor 10180 are connected together. A source of the reset transistor 10180 is tied to ground and a gate is connected to the input of the inverter 10160. The inverter 10150, the inverter 10160, and the resistor 10170 can be referred to as a second circuit.

The optimal cancellation point adjustment circuit 10200 (a third circuit) includes a comparator 10210 which has one input (e.g., a negative input) connected to each remaining end of the capacitor array 10140, the remaining end of resistor 10170, and the drain of the reset transistor 10180, and a remaining input (e.g., a positive input) connected to an output of a resistive digital-to-analog converter (RDAC) 10220, which has an input connected to a DREF [8:0] as described herein. An output of the comparator 10210 is connected to an input of the inverter 10300, which in turn has an output connected to an input of the divider 10400. An output of the divider 10400 is CKFB as described herein.

The bus width of the control signal Q[7:0] and DREF[7:0] are illustrative. For better matching and linearity of the DTC 9000, the binary coded quantization control signal Q[7:0] is converted to thermometer coded complementary signals TP[255:1] and TN[255:1] by the binary-to-thermometer converter 10110. The complementary signals TP[255:1] and TN[255:1] control a respective switch implemented by each element of the MPC array 10120 and MNC array 10120, which strongly connect any unit capacitor in the capacitor array C[255:1] 10140 to either $V_{DD}$ or ground at node CM[255:1]. The benefit of using the complementary controls of TP[255:1] and TN[255:1] is that any single unit capacitor C is never in a floating state. When only TP[255:1] or TN[255:1] is used, some unit capacitors will be in a floating state. Strictly speaking, the floating unit capacitors are weakly connected to either $V_{DD}$ or ground through the OFF drain to source resistance. This creates non-linearity in the DTC 9000. When node A is high and node B is low, node D is reset to ground by the reset transistor MR 10180. The cancellation code Q[7:0] needs to finish the change and be stabilized before node A transitions from high to low. When A starts transitioning from high to low, node D starts to be charged up by the PMOS transistor inside the inverter between node A and node B. One edge of the CKM or feedback clock with SDM quantization noise can be used to reset the DTC to remove memory effects and another edge of the CKM or feedback clock with SDM quantization noise can be used to align the quantization noise or phase error sequence and the cancellation code so that the quantization noise can be cancelled out with precision.

When the voltage of node D rises above $V_{REF}$, which is set by DREF through the RDAC 10220 or any voltage DAC, it triggers the output E of the comparator 10210 to toggle from high to low. Due to the existence of the convergence point X as discussed previously, all the falling edges of the comparator 10210 will happen at the ideal clock edges with an ideal clock period of the fractional clock frequency. This effectively removes the quantization noise from the falling edges of node E.

In some implementations, one or more inverters or buffers, such as the inverter 10300, can be used after the comparator 10210 to further sharpen the edge to be used by the PFD in the PLL loop as shown in FIG. 2.

In some implementations, if quantization noise needs to be cancelled on both edges of the clocks, a divide-by-2 divider, such as divider 10400 can be inserted to produce a clock with both edges clean. The divider 10400 can be clocked by the clean edge to produce a clock with both clean edges at half the clock frequency. If the MMD's output clock duty cycle is close to 50%, the same circuit will work except that the CKM's period needs be long enough before the convergence point X is reset by the reset edges.

Figure 11:
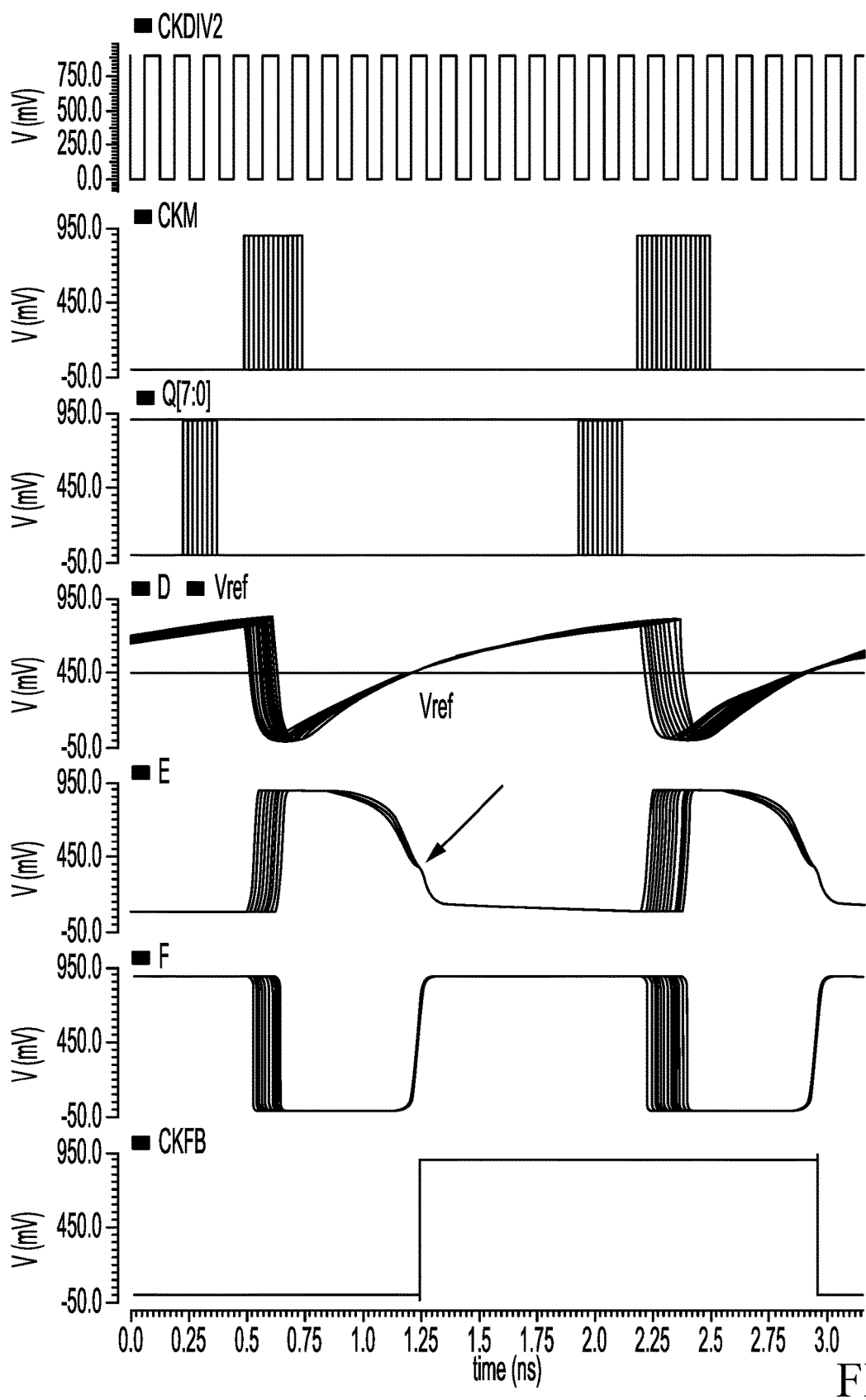
FIG. 11 are simulated eye diagrams of the DTC of FIG. 10 in accordance with embodiments of this disclosure.

FIG. 11 are simulated eye diagrams of the DTC 10000 of FIG. 10 in accordance with embodiments of this disclosure. As shown in the first panel of FIG. 11, the particulate MMD clock output of a simulated circuit has a pulse width of only one CKDIV2 period. As shown in the second panel of FIG. 11 for the CKM, the CKDIV2 narrow pulse's rise and falling edges are completely overlapped due to the SDM quantization noise. As shown in the third panel of FIG. 11, the cancellation codes Q [7:0] need to be positioned slightly before the rising edges of CKM. Signals at node A are simply the complementary of CKM. The rising edges of the signal at node A are used to reset the signal at node D. Contrary to the common belief that the reset signal must be a clean signal from the reference clock domain, these resetting rising edges of the signal from node A carry the same quantization noise sequence $\Phi[t]$. This reset arrangement works because it guarantees that the signal at node D has enough time to be discharged to ground and starts the charging up process at the exact falling edge of the signal at D with the same $\Phi[t]$ but at a rising rate determined by the cancellation code Q [7:0], whose polarity is just opposite of $\Phi[1]$. The reset signal also guarantees that earlier cancellation code Q[7:0] will not leak into later clocks. That is, there is no memory. This results in a very precise and clean quantization noise cancellation. The arrow in FIG. 11 indicates where cancellation occurs at the convergence point. The falling edge of the output of the comparator 10210 at node E is free of quantization noise because $V_{ref}$ is set at the convergence point X. The inverter 10300 is used to buffer and clean-up the signal (output at node F) from node E. The output signal at node E, at node F, or after the divider 10400 can be the CKFM, which can be used by the PFD or DTC to compare with the edge of CKREF.

Figure 12:
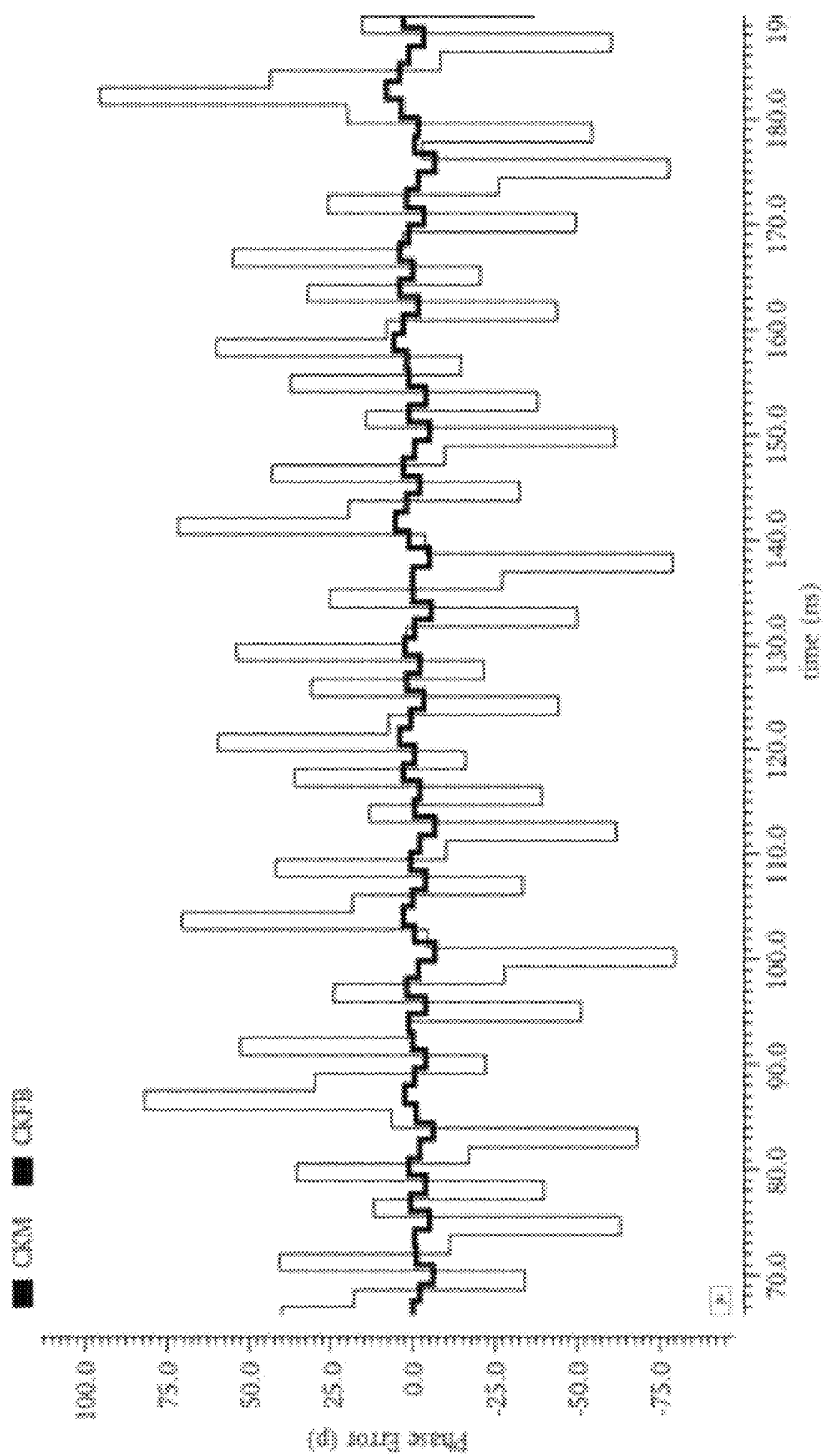
FIG. 12 is a diagram of simulated phase errors before and after quantization noise cancellation for the DTC of FIG. 10 in accordance with embodiments of this disclosure.
Figure 13:
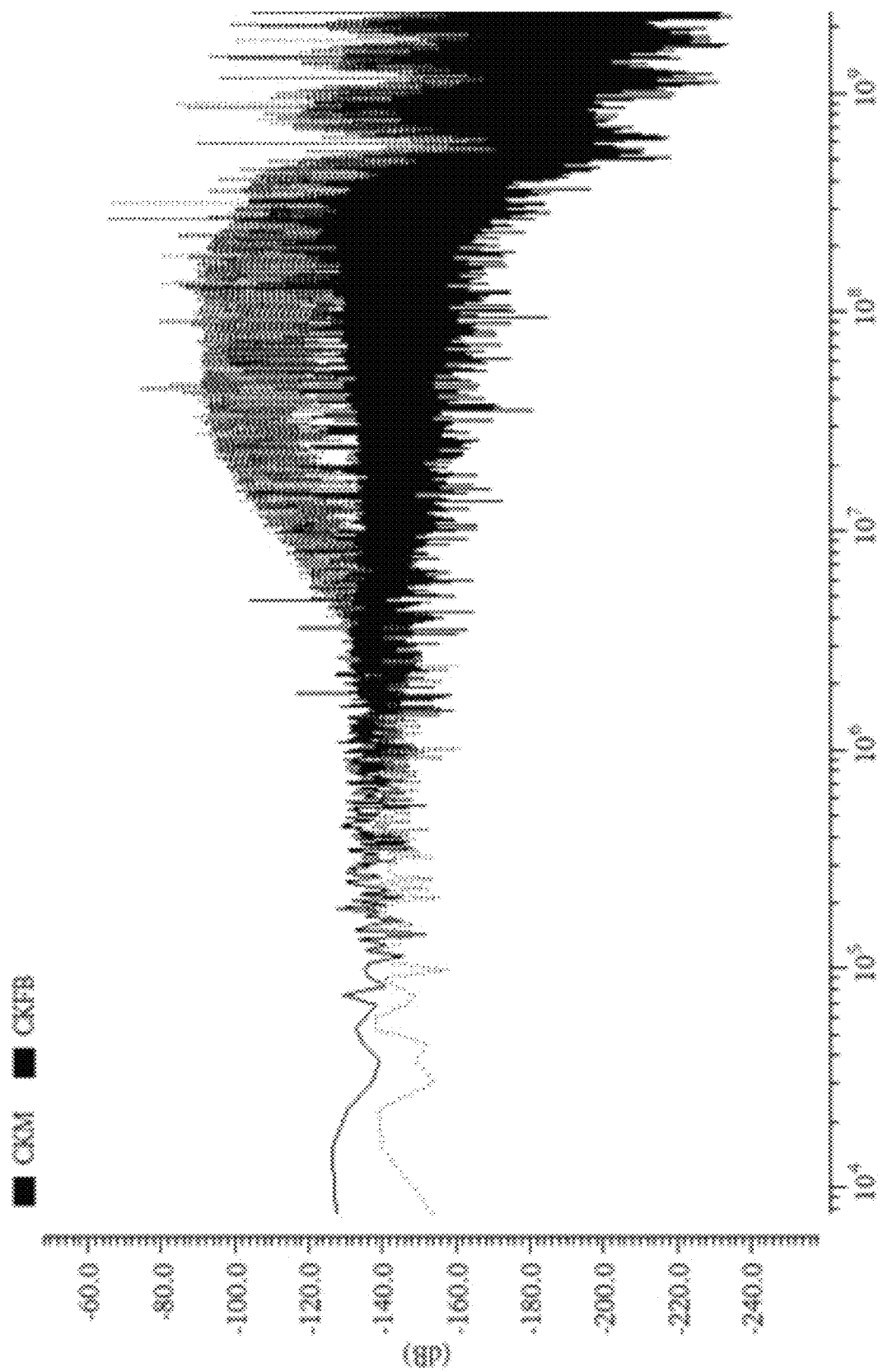
FIG. 13 is a diagram of simulated phase noise before and after quantization noise cancellation for the DTC of FIG. 10 in accordance with embodiments of this disclosure.

FIG. 12 is a diagram of simulated phase errors before and after quantization noise cancellation for the DTC 10000 of FIG. 10 in accordance with embodiments of this disclosure. The simulated phase domain errors are of the DTC input CKM and DTC output CKFB. FIG. 13 is a diagram of simulated phase noise before and after quantization noise cancellation for the DTC 10000 of FIG. 10 in accordance with embodiments of this disclosure. The simulated phase noise is of the DTC input CKM and DTC output CKFB.

The phase domain plots clearly show the phase noise amplitude difference before and after the quantization noise cancellation. It is also useful for determining the correct timing alignment. For a 16 VCO, CKDIV2 period is 125 ps. The peak-to-peak quantization noise from the SDM will be 125 ps. The quantization noise cancellation can easily reduce it to about 1 ps with only 8-bit DTC in the simulations. The 1 ps peak-to-peak residue quantization jitter is equivalent to a rms jitter of 1 ps/$\sqrt{12}$=288 fs. If smaller RMS jitter is required for a specific application, a DTC with more bits, and hence bigger area, can be used in the design.

The frequency domain plots also clearly show the quantization noise cancellation effect. The theoretical maximal improvement equation of the cancellation in relation to the number of bits is the same as that of a DAC and ADC: 6.02 dB*N where N is the DTC's number of control bus bits.

Figure 14:
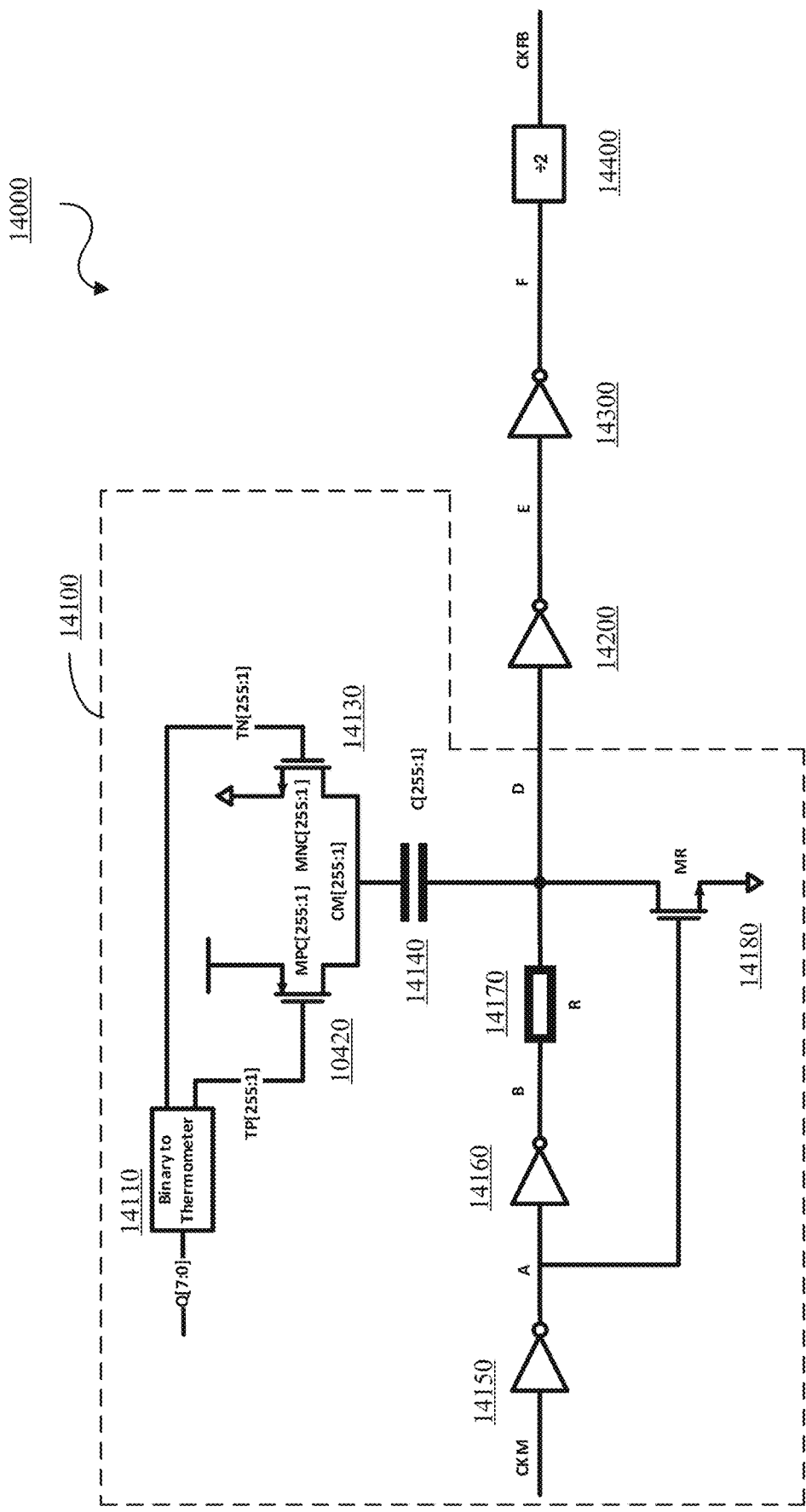
FIG. 14 is a block diagram of an example of a DTC for the SDM-based FPLL of FIG. 2 in accordance with embodiments of this disclosure.
Figure 15A:
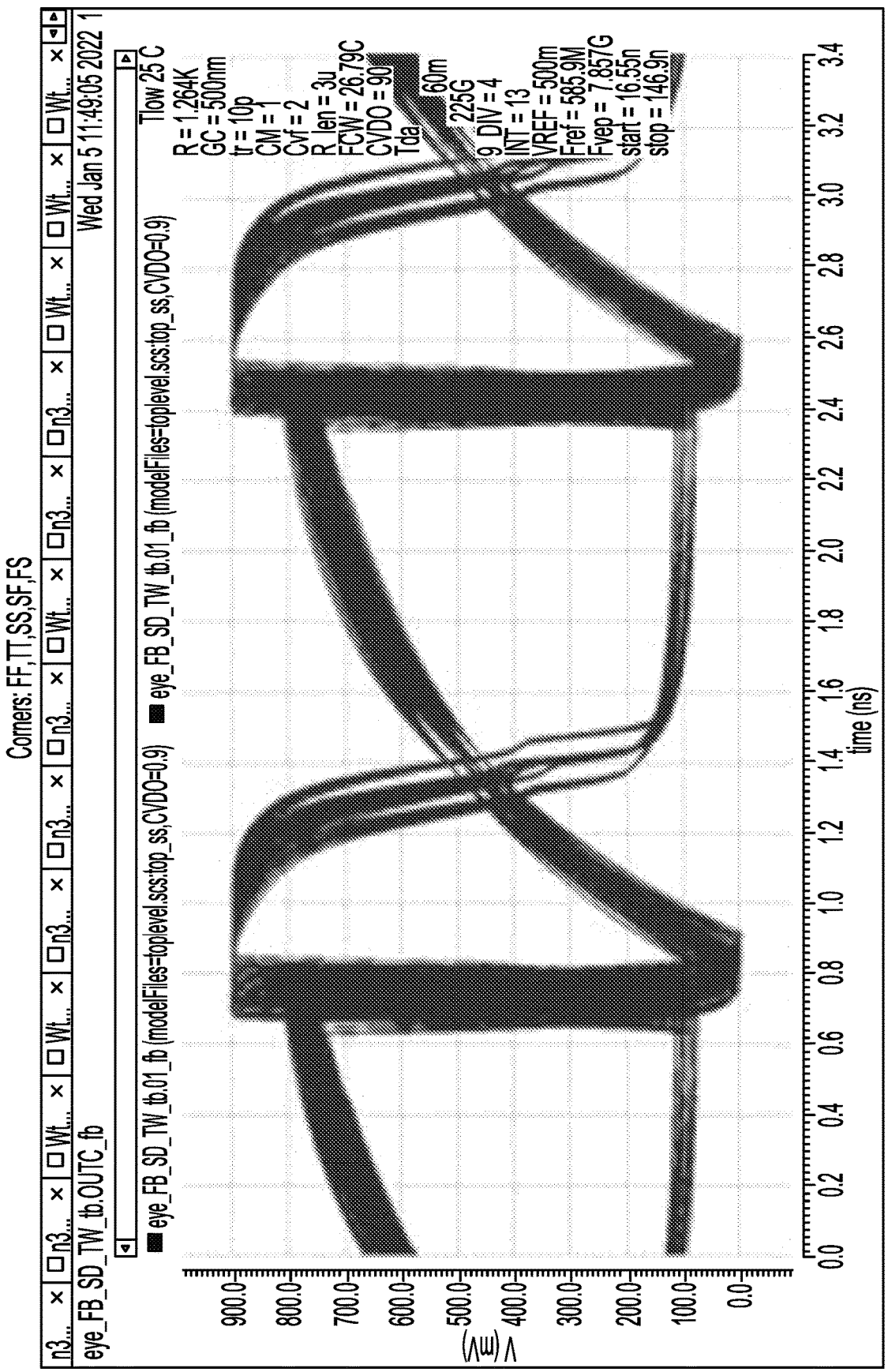
FIGS. 15A-F are diagrams of PVT sensitivities for the SDM-based FPLL of FIG. 2 in accordance with embodiments of this disclosure.
Figure 15B:
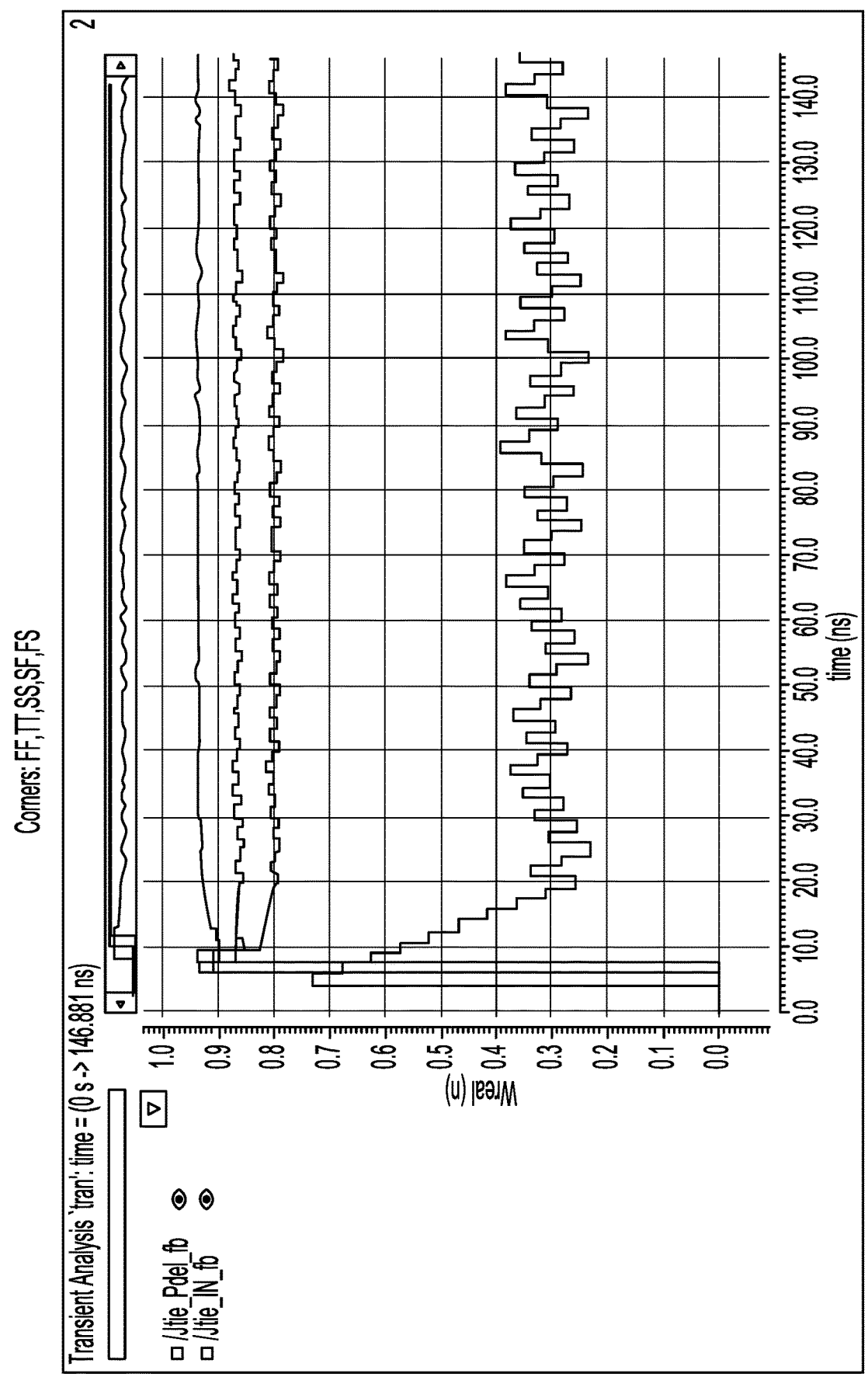
Figure 15C:
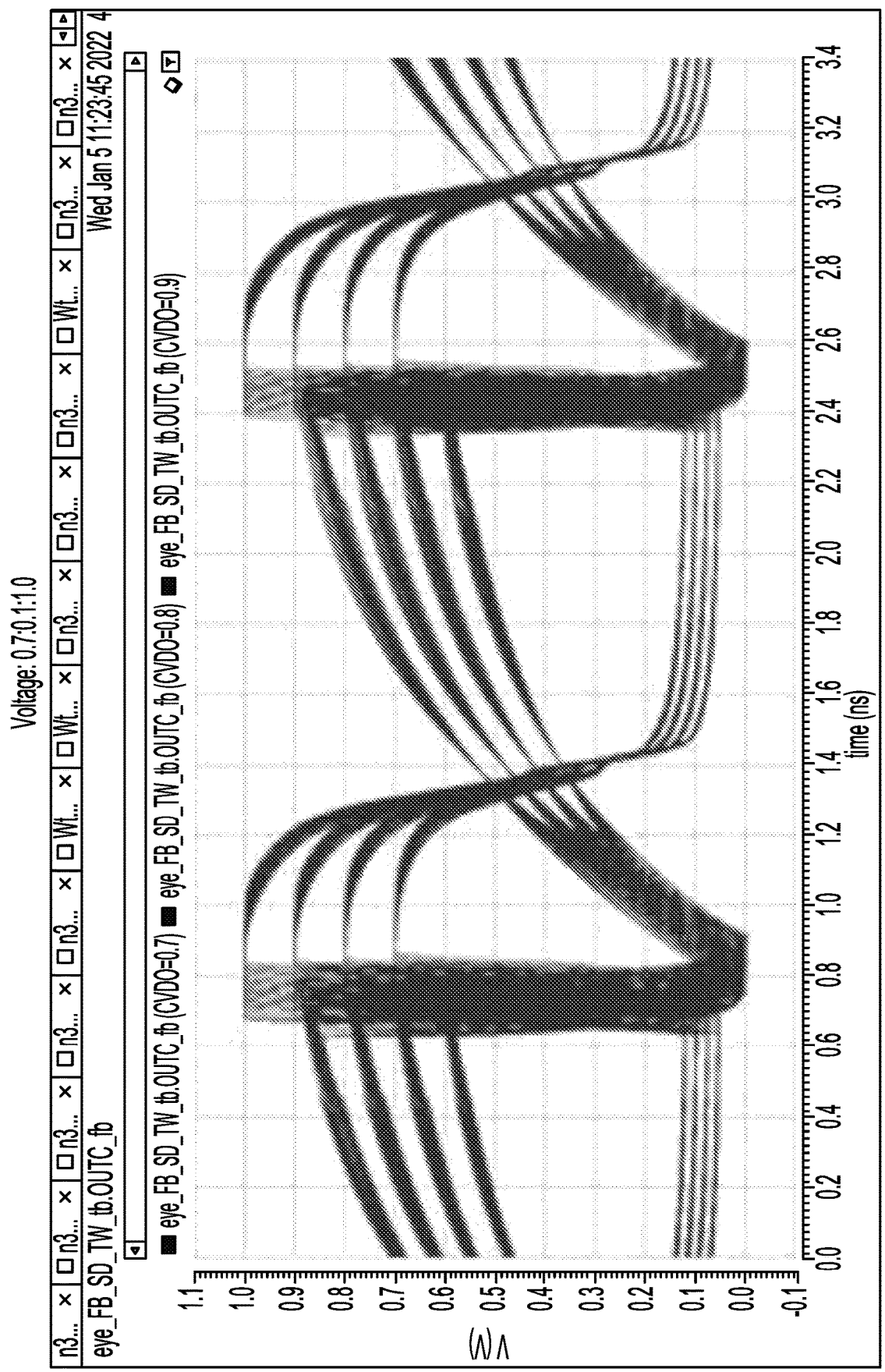
Figure 15D:
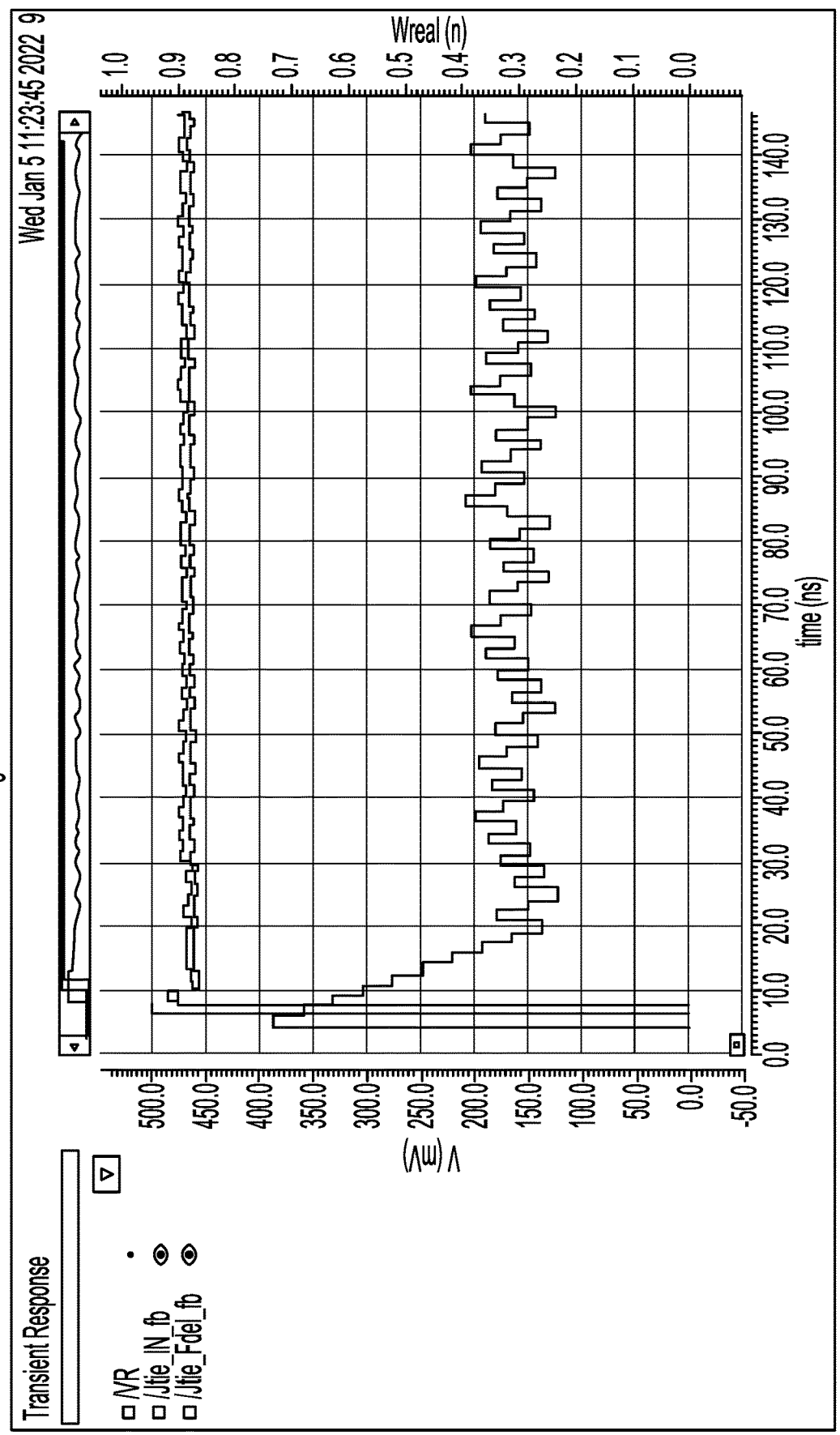
Figure 15E:
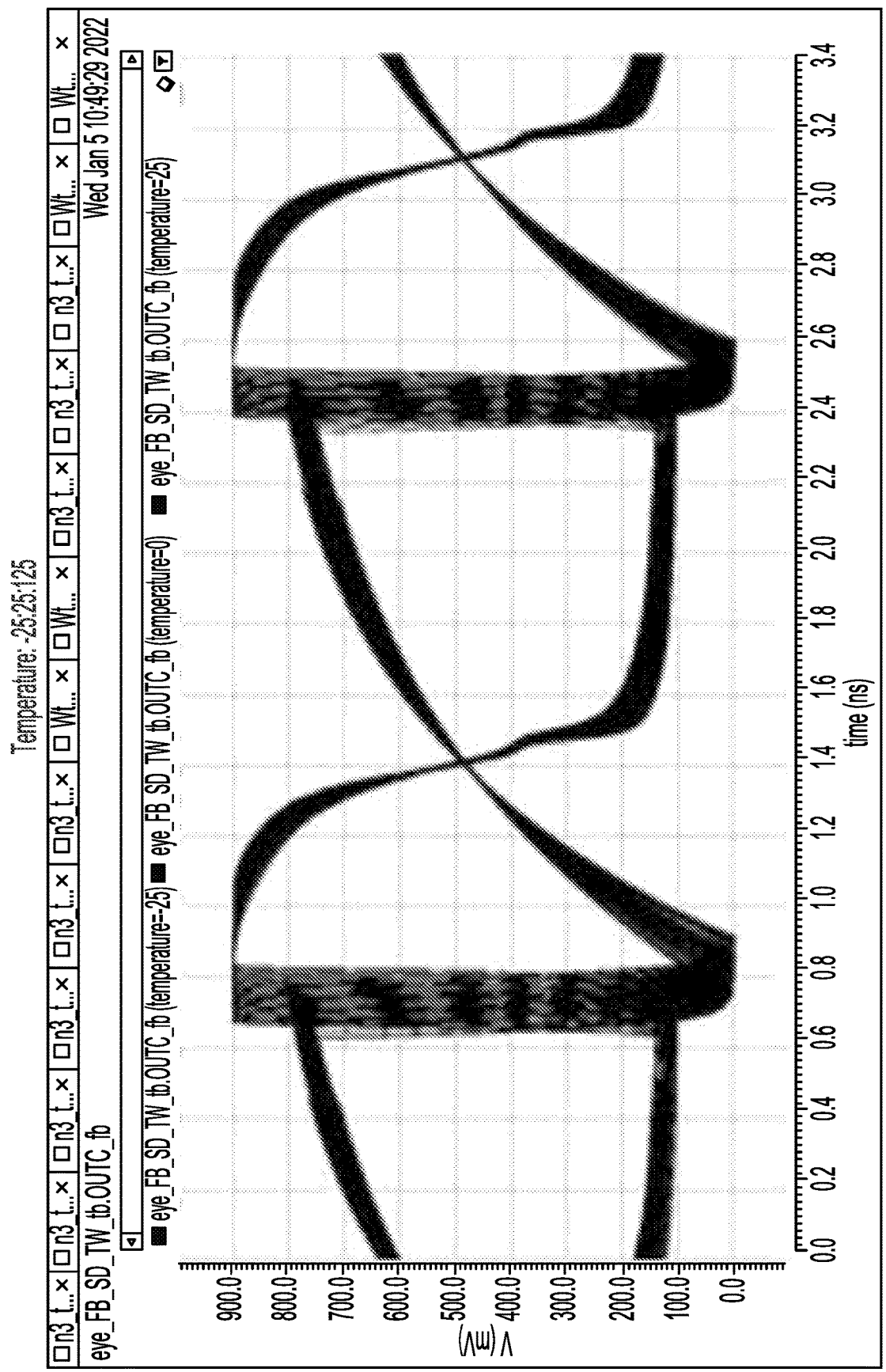
Figure 15F:
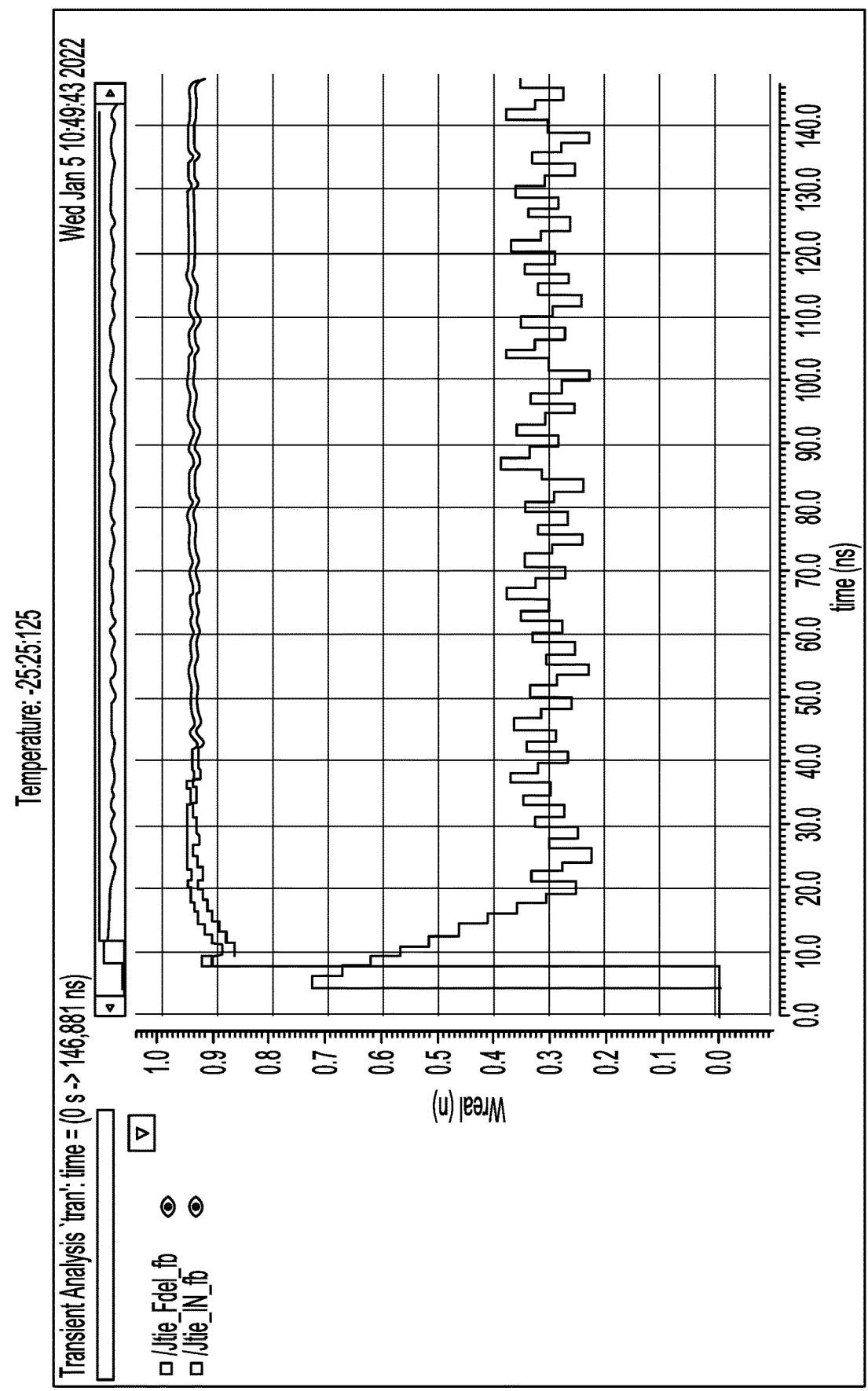

FIG. 14 is a block diagram of an example of a DTC 14000 for the SDM-based FPLL of FIG. 2 in accordance with embodiments of this disclosure. The DTC 14000 is similar structurally and operationally to the DTC 10000 of FIG. 10 except that there is no optimal cancellation point adjustment circuit. In these implementations, changes in the reference voltage are within a defined range and acceptable for the application in question. The DTC 14000 includes a cancellation circuit 14100, an inverter 14200, an inverter 14300, and a divider 14400. For example, the divider 14400 can be a divide by 2 divider. A cancellation code (Q[7:0]) and a CKM are inputs to the cancellation circuit 10100.

The cancellation circuit 14100 includes a binary-to-thermometer converter 14110, which has an input connected to the cancellation code. An output of the binary-to-thermometer converter 14110 is connected to an array of p-channel transistors (MPC [255:1]) or switches 14120 and an array of n-channel transistors (MNC [255:1]) or switches 14130. Specifically, the output of the binary-to-thermometer converter 14110 is connected to a respective gate of a p-channel transistor (MPC) 14120 and a respective gate of a n-channel transistor (MNC) 14130. Each source of the MPC array 14120 is tied to $V_{DD}$ and each source of the MNC array 14130 is tied to ground. Each drain of the MPC array 14120 and the drain of the MNC array 14130 is connected to one end of a respective capacitor in a capacitor array C[255:1] 14140. The cancellation circuit 14100 includes an inverter 14150, which has an input connected to the CKM. An output of the inverter 14150 is connected to an input of an inverter 14160, which in turn has an output connected to one end of a resistor 14170. Each remaining end of the capacitor array 14140, the remaining end of resistor 14170, and a drain of a reset transistor 14180 are connected together. A source of the reset transistor 14180 is tied to ground and a gate is connected to the input of the inverter 14160.

An input of the inverter 14200 is connected to each remaining end of the capacitor array 14140, the remaining end of resistor 14170, and the drain of the reset transistor 14180. An output of the inverter 14200 is connected to an input of the inverter 14300, which in turn has an output connected to an input of the divider 14400. An output of the divider 14400 is CKFB as described herein.

FIGS. 15A-F are simulated eye diagrams and jitters of PVT sensitivities for the DTC 14000 of FIG. 14 in accordance with embodiments of this disclosure. As shown, the residual jitter after quantization cancellation is less sensitive to the temperature and the $V_{DD}$ supply than to the process corners.

Figure 16:
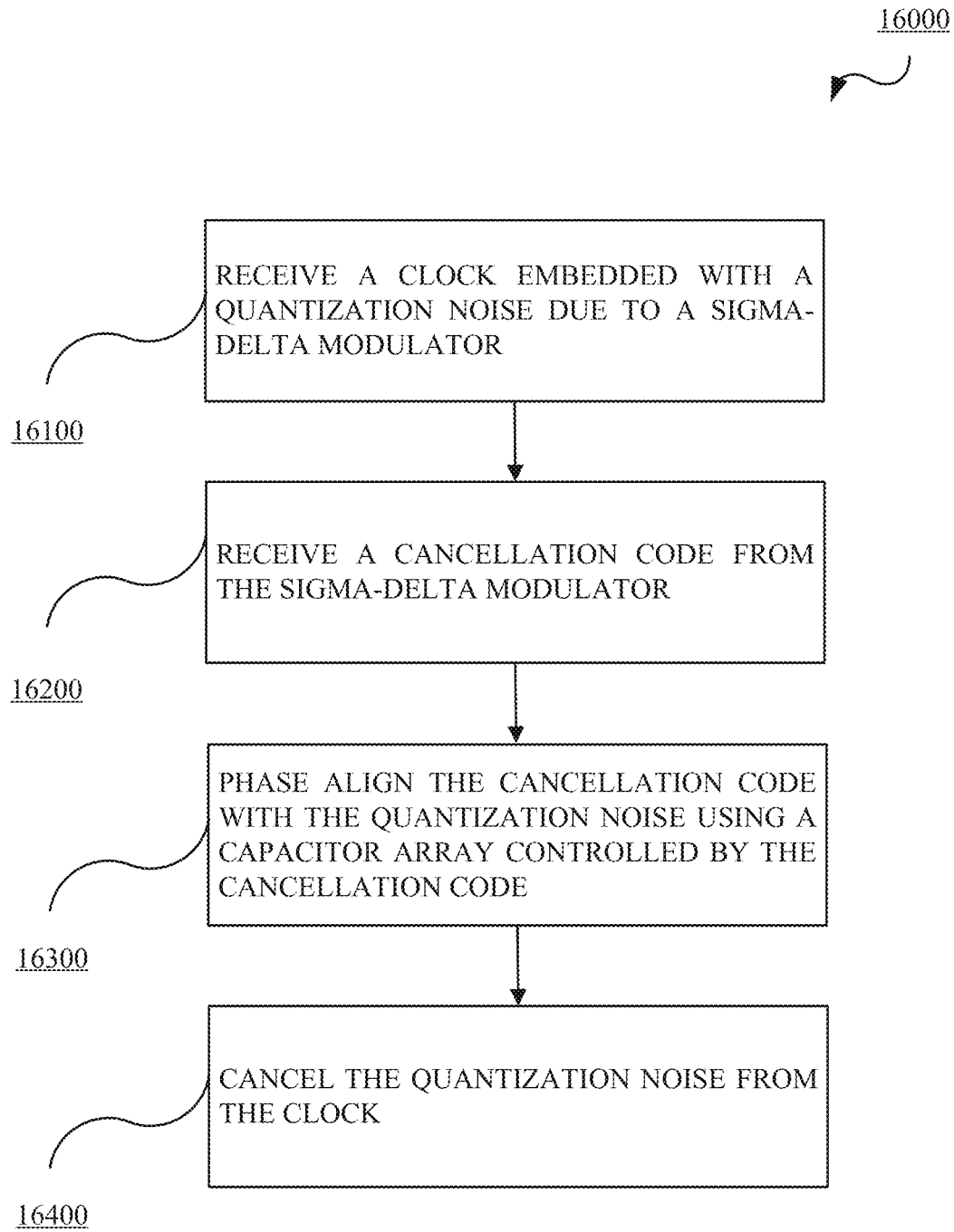
FIG. 16 is a flowchart of an example technique for SDM quantization noise cancellation in accordance with embodiments of this disclosure.

FIG. 16 is a flowchart of an example method 16000 for SDM quantization noise cancellation in accordance with embodiments of this disclosure. The method 16000 includes: receiving 16100 a clock embedded with a quantization noise due to a sigma-delta modulator; receiving 16200 a cancellation code from the sigma-delta modulator; phase aligning 16300 the cancellation code with the quantization noise using a capacitor array controlled by the cancellation code; and cancelling 16400 the quantization noise from the clock. The method 16000 may be implemented, as appropriate and applicable, by the PLL 2000 of FIG. 2, the SDM 9000 of FIG. 9, the DTC 10000 of FIG. 10, and the DTC 14000 of FIG. 14.

The method 16000 includes receiving 16100 a clock embedded with a quantization noise due to a sigma-delta modulator. A DTC can be used in a sigma-delta modulator based FPLL. The output clock of the PLL is feedback to compare against a reference clock. The output clock undergoes processing to fractionally divide the output clock. The fractional division is based, in part, by controlling or modulating the output clock based on a sigma-delta modulator clock from the sigma-delta modulator. This processing produces and/or embeds quantization noise on the now fractionally divided output clock.

The method 16000 includes receiving 16200 a cancellation code from the sigma-delta modulator. An internal integrator of the sigma-delta modulator includes or has a signal that can cancel the quantization noise. An output of the internal integrator of the sigma-delta modulator is tapped to connect this signal to the DTC.

The method 16000 includes phase aligning 16300 the cancellation code with the quantization noise using a capacitor array controlled by the cancellation code and cancelling 16400 the quantization noise from the clock. The DTC uses the capacitor array to obtain the phase delay needed to match the quantization noise. The DTC also includes a reset signal that resets the DTC for each new quantization code. This prevents memory effects from one quantization code to another quantization code. One edge of the now fractionally divided output clock can be used to reset the DTC and another edge can be used to phase align the cancellation code and the quantization noise.

In general, a fractional phase includes a digital filter configured to receive an error signal based on a comparison of a reference clock and a feedback clock, a controlled oscillator configured to generate an output clock by adjusting a frequency of the controlled oscillator based on a control signal output by the digital filter, the feedback clock being based on the output clock, a sigma-delta modulator configured to control division of the output clock to generate a divided output clock which includes a sigma-delta modulator quantization noise and a digital-to-time converter configured to receive a cancellation code from an integrator in the sigma-delta modulator and cancel the sigma-delta modulator quantization noise in the divided output clock with the cancellation code to generate the feedback clock.

In some implementations, the digital-to-time converter includes a capacitor array digitally controlled by the cancellation code to achieve a desired phase delay of the cancellation code to substantially match a phase of the sigma-delta modulator quantization noise. In some implementations, a cancellation point is determined by setting a resistor-full scale capacitor array constant to a target period of the controlled oscillator and implementing to a defined voltage. In some implementations, the digital-to-time converter includes a cancellation circuit configured to phase align and cancel the sigma-delta modulator quantization noise with the cancellation code to generate an output, the cancellation circuit having a convergence point based on setting a resistor-capacitor constant to a controlled oscillator target period and implementing to a defined voltage and a cancellation point adjustment circuit configured to compensate for voltage based changes in the convergence point by comparing the output of the cancellation circuit with a reference voltage which tracks the voltage based changes. In some implementations, the voltage based changes are tracked using a least means square algorithm which uses a statistical output from the digital filter. In some implementations, the digital-to-time converter includes a reset circuit configured to reset the digital-to-time converter to a zero voltage value for each cancellation code. In some implementations, the digital-to-time converter uses one edge of the divided output clock to reset the digital-to-time converter to remove memory effects for each cancellation code and uses another edge of the divided output clock to substantially phase align the sigma-delta modulator quantization noise and the cancellation code.

In general, a digital-to-time converter includes a first circuit configured to receive a cancellation code and a second circuit configured to receive a clock embedded with a quantization noise due to a sigma-delta modulator. The first circuit and the second circuit are collectively configured to phase align and cancel the sigma-delta modulator quantization noise with the cancellation code to generate an output clock. The digital-to-time converter has a cancellation point based on setting a resistor-capacitor constant of the digital-to-time converter to a controlled oscillator target period and implementing to a defined voltage.

In some implementations, the cancellation code is received from an internal integrator of the sigma-delta modulator. In some implementations, the first circuit includes a capacitor array digitally controlled by the cancellation code to obtain a desired phase delay for substantially matching the quantization noise. In some implementations, the digital-to-time converter further includes a third circuit configured to compensate for voltage based changes in the cancellation point by comparing the output clock from the first circuit and the second circuit with a reference voltage which tracks the voltage based changes. In some implementations, the voltage based changes are tracked using a least means square algorithm which uses a statistical output from a digital filter in a phase locked loop. In some implementations, the digital-to-time converter further includes a reset circuit configured to reset the digital-to-time converter to a zero voltage value for each cancellation code. In some implementations, the first circuit and the second circuit use one edge of the clock to reset the digital-to-time converter to remove memory effects for each cancellation code and use another edge of the clock to substantially phase align the quantization noise with the cancellation code.

In general, a method for improved quantization noise cancellation includes receiving, at a digital-to-time converter, a cancellation code from a sigma-delta modulator, receiving, at the digital-to-time converter, a clock embedded with a quantization noise due to the sigma-delta modulator, phase aligning, by the digital-to-time converter, the cancellation code with the quantization noise using a capacitor array controlled by the cancellation code and cancelling, by the digital-to-time converter, the quantization noise from the clock. The digital-to-time converter has a cancellation point based on setting a resistor-capacitor array constant of the digital-to-time converter to a controlled oscillator target period and implementing to a defined voltage.

In some implementations, the cancellation code is received from an internal integrator of the sigma-delta modulator. In some implementations, the method further includes compensating for voltage based changes in the cancellation point by comparing a quantization noise cancelled clock with a reference voltage which tracks the voltage based changes. In some implementations, the method further includes tracking the voltage based changes using a least means square algorithm which uses a statistical output from a digital filter in a phase locked loop. In some implementations, the method further includes resetting the digital-to-time converter to a zero voltage value for each cancellation code. In some implementations, the method further includes using one edge of the clock to reset the digital-to-time converter to remove memory effects for each cancellation code and using another edge of the clock to substantially phase align the quantization noise with the cancellation code.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A fractional phase locked loop comprising:
 a digital filter configured to receive an error signal based on a comparison of a reference clock and a feedback clock;
 a controlled oscillator configured to generate an output clock by adjusting a frequency of the controlled oscillator based on a control signal output by the digital filter, the feedback clock being based on the output clock;
 a sigma-delta modulator configured to control division of the output clock to generate a divided output clock which includes a sigma-delta modulator quantization noise; and a digital-to-time converter configured to
    receive a cancellation code from an integrator in the sigma-delta modulator; and
    cancel the sigma-delta modulator quantization noise in the divided output clock with the cancellation code to generate the feedback clock, and
the digital-to-time converter comprising
    a cancellation circuit configured to phase align and cancel the sigma-delta modulator quantization noise with the cancellation code to generate an output, the cancellation circuit having a convergence point based on setting a resistor-capacitor constant to a controlled oscillator target period and implementing to a defined voltage; and
    a cancellation point adjustment circuit configured to compensate for voltage based changes in the convergence point by comparing the output of the cancellation circuit with a reference voltage which tracks the voltage based changes,
    wherein the voltage based changes are tracked using a least means square algorithm which uses a statistical output from the digital filter.

2. The fractional phase locked loop of claim 1, the digital-to-time converter comprising a capacitor array digitally controlled by the cancellation code to achieve a desired phase delay of the cancellation code to substantially match a phase of the sigma-delta modulator quantization noise.

3. The fractional phase locked loop of claim 2, wherein a cancellation point is determined by setting a resistor-full scale capacitor array constant to a target period of the controlled oscillator and implementing to a defined voltage.

4. The fractional phase locked loop of claim 1, the digital-to-time converter comprising a reset circuit configured to reset the digital-to-time converter to a zero voltage value for each cancellation code.

5. The fractional phase locked loop of claim 1, wherein the digital-to-time converter uses one edge of the divided output clock to reset the digital-to-time converter to remove memory effects for each cancellation code and uses another edge of the divided output clock to substantially phase align the sigma-delta modulator quantization noise and the cancellation code.

6. A digital-to-time converter comprising:
    a first circuit configured to receive a cancellation code; and
    a second circuit configured to receive a clock embedded with a quantization noise due to a sigma-delta modulator,
    wherein the first circuit and the second circuit are collectively configured to phase align and cancel the sigma-delta modulator quantization noise with the cancellation code to generate an output clock, and
    wherein the digital-to-time converter has a cancellation point based on setting a resistor-capacitor constant of the digital-to-time converter to a controlled oscillator target period and implementing to a defined voltage,
    wherein the first circuit and the second circuit use one edge of the clock to reset the digital-to-time converter to remove memory effects for each cancellation code and use another edge of the clock to substantially phase align the quantization noise with the cancellation code.

7. The digital-to-time converter of claim 6, wherein the cancellation code is received from an internal integrator of the sigma-delta modulator.

8. The digital-to-time converter of claim 6, wherein the first circuit includes a capacitor array digitally controlled by the cancellation code to obtain a desired phase delay for substantially matching the quantization noise.

9. The digital-to-time converter of claim 6, further comprising a third circuit configured to compensate for voltage based changes in the cancellation point by comparing the output clock from the first circuit and the second circuit with a reference voltage which tracks the voltage based changes.

10. The digital-to-time converter of claim 9, wherein the voltage based changes are tracked using a least means square algorithm which uses a statistical output from a digital filter in a phase locked loop.

11. The digital-to-time converter of claim 6, further comprising a reset circuit configured to reset the digital-to-time converter to a zero voltage value for each cancellation code.

12. A method for improved quantization noise cancellation, the method comprising:
    receiving, at a digital-to-time converter, a cancellation code from a sigma-delta modulator;
    receiving, at the digital-to-time converter, a clock embedded with a quantization noise due to the sigma-delta modulator;
    phase aligning, by the digital-to-time converter, the cancellation code with the quantization noise using a capacitor array controlled by the cancellation code; and
    cancelling, by the digital-to-time converter, the quantization noise from the clock,
    wherein the digital-to-time converter has a cancellation point based on setting a resistor-capacitor array constant of the digital-to-time converter to a controlled oscillator target period and implementing to a defined voltage, and
    wherein voltage based changes in the cancellation point are tracked using a least means square algorithm which uses a statistical output from a digital filter in a phase locked loop.

13. The method of claim 12, wherein the cancellation code is received from an internal integrator of the sigma-delta modulator.

14. The method of claim 12, further comprising compensating for the voltage based changes in the cancellation point by comparing a quantization noise cancelled clock with a reference voltage which tracks the voltage based changes.

15. The method of claim 12, further comprising resetting the digital-to-time converter to a zero voltage value for each cancellation code.

16. The method of claim 12, further comprising
    using one edge of the clock to reset the digital-to-time converter to remove memory effects for each cancellation code; and
    using another edge of the clock to substantially phase align the quantization noise with the cancellation code.

* * * * *